(12) United States Patent
Chang et al.

(10) Patent No.: US 10,700,008 B2
(45) Date of Patent: Jun. 30, 2020

(54) PACKAGE STRUCTURE HAVING REDISTRIBUTION LAYER STRUCTURES

(71) Applicant: Taiwan Semiconductor Manufacturing Co., Ltd., Hsinchu (TW)

(72) Inventors: Chih-Hao Chang, Hsinchu County (TW); Hao-Yi Tsai, Hsinchu (TW); Tsung-Hsien Chiang, Hsinchu (TW); Tin-Hao Kuo, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/992,198

(22) Filed: May 30, 2018

(65) Prior Publication Data

US 2019/0371734 A1 Dec. 5, 2019

(51) Int. Cl.
*H01L 23/532* (2006.01)
*H01L 23/31* (2006.01)
*H01L 23/52* (2006.01)
*H01L 23/522* (2006.01)
*H01L 23/00* (2006.01)
*H01L 21/56* (2006.01)

(52) U.S. Cl.
CPC ...... *H01L 23/53238* (2013.01); *H01L 21/566* (2013.01); *H01L 23/3185* (2013.01); *H01L 23/5226* (2013.01); *H01L 24/09* (2013.01); *H01L 24/17* (2013.01); *H01L 2224/0231* (2013.01); *H01L 2224/0239* (2013.01); *H01L 2224/02331* (2013.01)

(58) Field of Classification Search
CPC .......... H01L 23/53238; H01L 23/3185; H01L 23/5226; H01L 24/09; H01L 24/17
See application file for complete search history.

(56) References Cited

U.S. PATENT DOCUMENTS

| | | | |
|---|---|---|---|
| 8,748,232 B2 * | 6/2014 | Samoilov | .......... H01L 21/76898 438/118 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,324,582 B2 * | 4/2016 | Lin | ...................... H01L 23/3114 |
| 9,368,460 B2 | 6/2016 | Yu et al. | |
| 9,372,206 B2 | 6/2016 | Wu et al. | |

(Continued)

*Primary Examiner* — Ida M Soward
(74) *Attorney, Agent, or Firm* — JCIPRNET

(57) ABSTRACT

A package structure and a method of manufacturing the same are provided. The package structure includes a die, a RDL structure, an encapsulant and a conductive terminal. The die is on a redistribution layer (RDL) structure. The RDL structure comprises a polymer layer and a RDL in the polymer layer. The encapsulant is on the RDL structure and laterally aside the die. The encapsulant comprises a body part and an extending part underlying the body part. The conductive terminal is electrically connected to the RDL structure and the die. The body part of the encapsulant encapsulates sidewalls of the die. The extending part of the encapsulant extends into the polymer layer.

20 Claims, 18 Drawing Sheets

(56) References Cited

U.S. PATENT DOCUMENTS

| | | | |
|---|---|---|---|
| 9,496,189 B2 | 11/2016 | Yu et al. | |
| 9,520,304 B2* | 12/2016 | Chang | H01L 25/0655 |
| 9,589,841 B2* | 3/2017 | Chen | H01L 21/563 |
| 9,721,922 B2* | 8/2017 | Marimuthu | H01L 24/97 |
| 9,991,239 B2* | 6/2018 | Nair | H01L 21/568 |
| 10,096,553 B2* | 10/2018 | Su | H01L 21/4842 |
| 10,269,764 B2* | 4/2019 | Chen | H01L 21/4857 |
| 10,468,345 B2* | 11/2019 | Liao | H01L 23/50 |
| 2011/0316171 A1* | 12/2011 | Shim, II | H01L 21/568 |
| | | | 257/774 |
| 2013/0062760 A1* | 3/2013 | Hung | H01L 21/561 |
| | | | 257/738 |
| 2014/0015131 A1* | 1/2014 | Meyer | H01L 23/49816 |
| | | | 257/738 |
| 2016/0056126 A1* | 2/2016 | Yu | H01L 21/565 |
| | | | 257/737 |
| 2016/0190101 A1* | 6/2016 | Yu | H01L 25/50 |
| | | | 257/774 |
| 2016/0307872 A1* | 10/2016 | Chen | H01L 21/4857 |
| 2018/0069163 A1* | 3/2018 | Clark | H01L 33/44 |
| 2018/0286823 A1* | 10/2018 | Tai | H01L 24/02 |
| 2018/0366347 A1* | 12/2018 | Chuang | H01L 23/5389 |
| 2019/0115271 A1* | 4/2019 | Chiang | H01L 23/3128 |
| 2019/0121952 A1* | 4/2019 | Huang | G06F 21/32 |
| 2019/0131243 A1* | 5/2019 | Chiu | H01L 23/5389 |
| 2019/0131269 A1* | 5/2019 | Lee | H01L 24/19 |
| 2019/0139911 A1* | 5/2019 | Gutierrez, III | H01L 23/49822 |
| 2019/0157208 A1* | 5/2019 | Lin | H01L 23/5389 |
| 2019/0157228 A1* | 5/2019 | Yu | H01L 23/5389 |
| 2019/0237423 A1* | 8/2019 | Chen | H01L 21/568 |
| 2019/0244907 A1* | 8/2019 | Liao | H01L 21/561 |

* cited by examiner

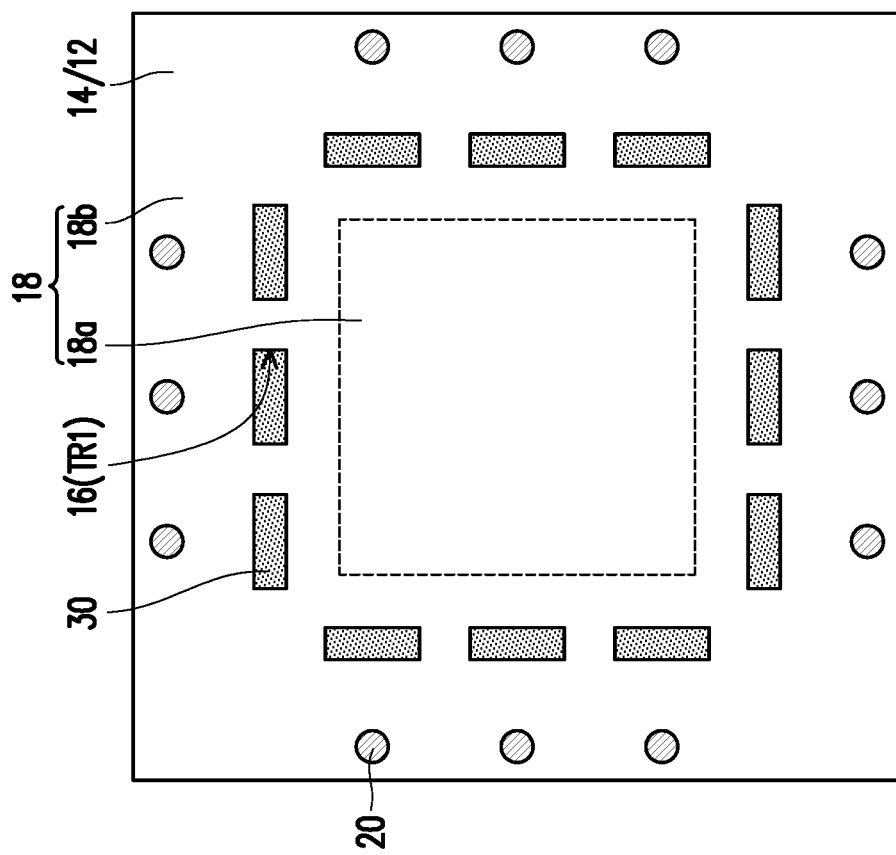
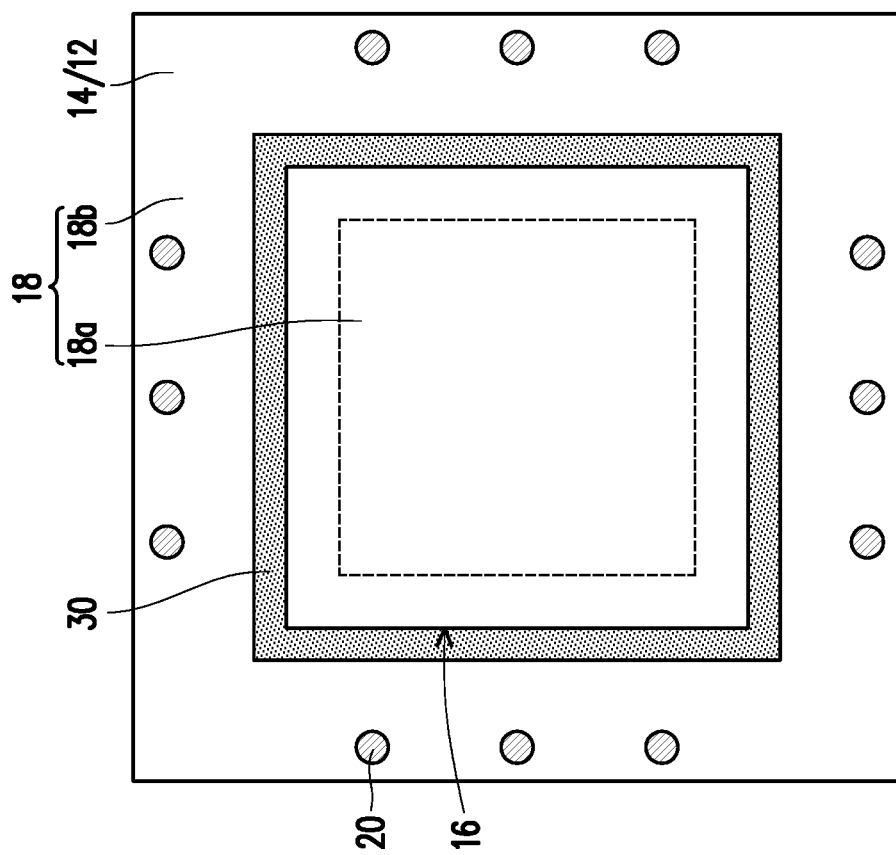

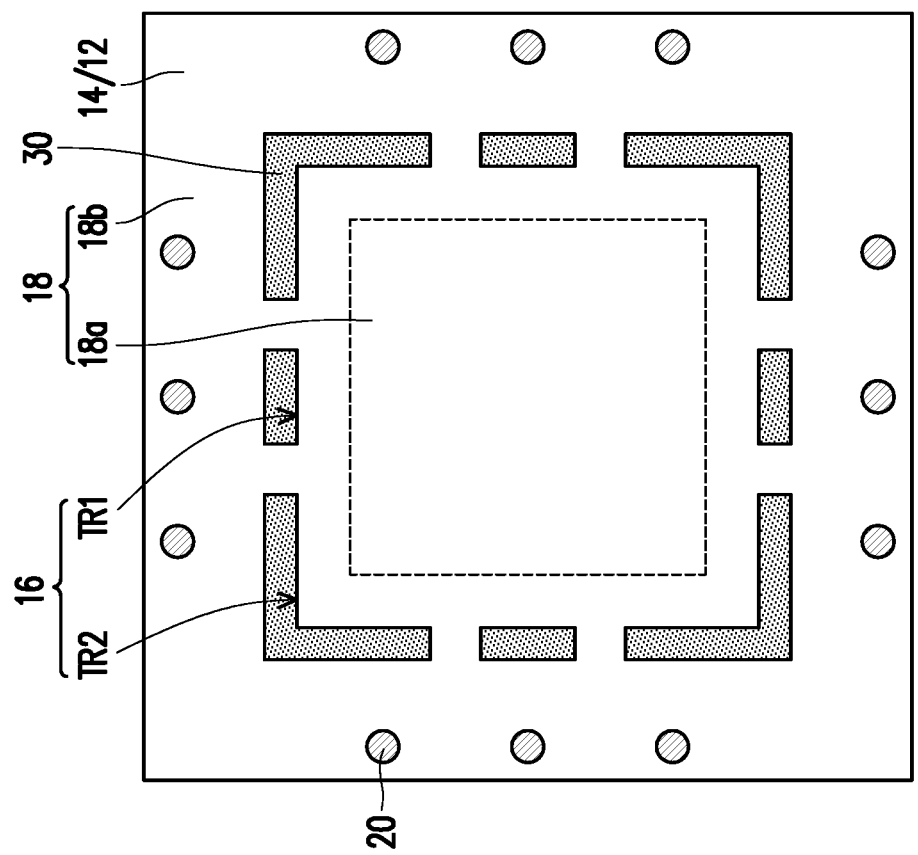
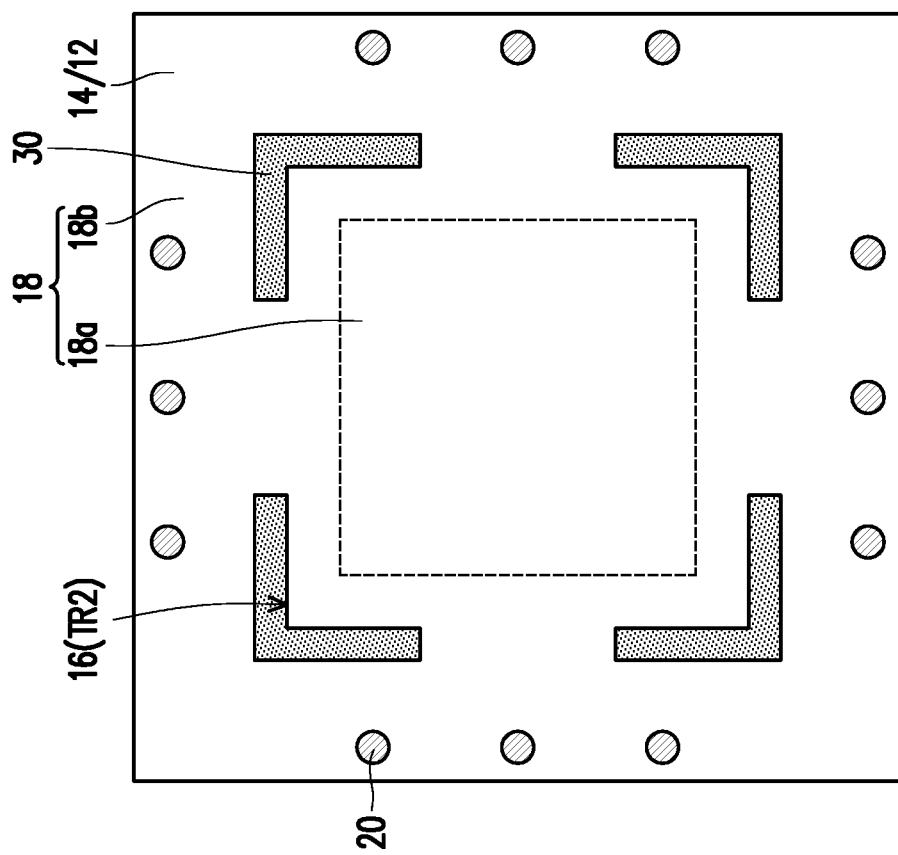
FIG. 4D
FIG. 4C

PACKAGE STRUCTURE HAVING REDISTRIBUTION LAYER STRUCTURES

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness.

BRIEF DESCRIPTION OF THE DRAWINGS

FIG. 4A to FIG. 4E are top views of package structures according to some embodiments of the disclosure.

DETAILED DESCRIPTION

Figure 1A:
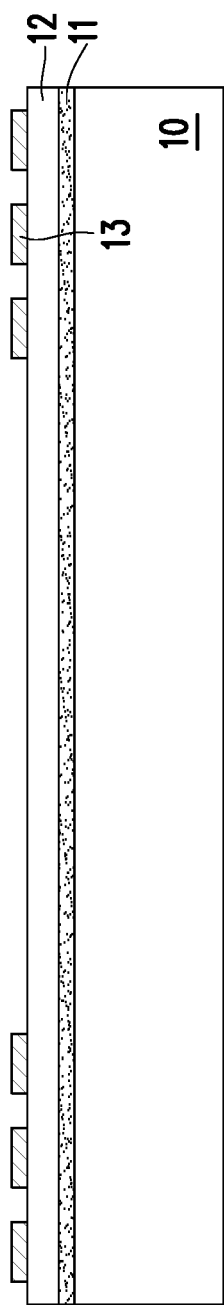
FIG. 1A to FIG. 1H are schematic cross-sectional views illustrating a method of forming a package structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views illustrating a method of forming a package structure according to a first embodiment of the disclosure.

Referring to FIG. 1A, a carrier 10 is provided. The carrier 10 may be a glass carrier, a ceramic carrier, or the like. A release layer 11 is formed on the carrier 10 by, for example, a spin coating method. In some embodiments, the release layer 11 may be formed of a polymer-based material such as an Ultra-Violet (UV) glue, a Light-to-Heat Conversion (LTHC) material, an epoxy-based thermal-release material, or the like. The release layer 11 is decomposable under the heat of light to thereby release the carrier 10 from the overlying structures that will be formed in subsequent steps.

A first polymer layer 12 is formed on the release layer 11. The first polymer layer 12 may be a single layer structure or a multi-layer structure. In some embodiments, the first polymer layer 12 includes polybenzoxazole (PBO), polyimide (PI), benzocyclobutene (BCB), ajinomoto buildup film (ABF), solder resist film (SR), or the like, or a combination thereof, but the disclosure is not limited thereto. In some other embodiments, the first polymer layer 12 may be replaced by a dielectric layer. The dielectric layer may include a nitride such as silicon nitride, an oxide such as silicon oxide, an oxynitride such as silicon oxynitride, phosphosilicate glass (PSG), borosilicate glass (BSG), boron-doped phosphosilicate glass (BPSG), or the like, or a combination thereof. The first polymer layer 12 is formed by a suitable fabrication technique such as spin-coating, lamination, deposition, or the like. The deposition includes chemical vapor deposition, for example.

Still referring to FIG. 1A, a redistribution layer (RDL) 13 is formed on the first polymer layer 12. The RDL 13 includes conductive materials. The conductive materials includes metal, metal compound or metal alloy, such as copper, nickel, titanium, aluminum, copper alloy, aluminum alloy, titanium nitride or the like, or a combination thereof. In some embodiments, the RDL 13 includes a seed layer (not shown) and a conductive layer formed thereon (not shown). The seed layer may be a metal seed layer such as a copper seed layer. In some embodiments, the seed layer includes a first metal layer such as a titanium layer and a second metal layer such as a copper layer over the first metal layer. The conductive layer may be copper or other suitable metals.

In some embodiments, the RDL 13 is formed by the following processes: a seed layer is formed on the first polymer layer 12 by sputtering, for example. A patterned mask is formed on the seed layer, the patterned mask have a plurality of openings exposing a portion of the top surface of the seed layer. The conductive layer is formed on the seed layer exposed by the openings of the patterned mask through plating, for example. Thereafter, the patterned mask is stripped, the seed layer not covered by the conductive layer is removed by an etching process. Thus, the conductive layer and the underlying seed layer form the RDL 13.

Figure 1B:
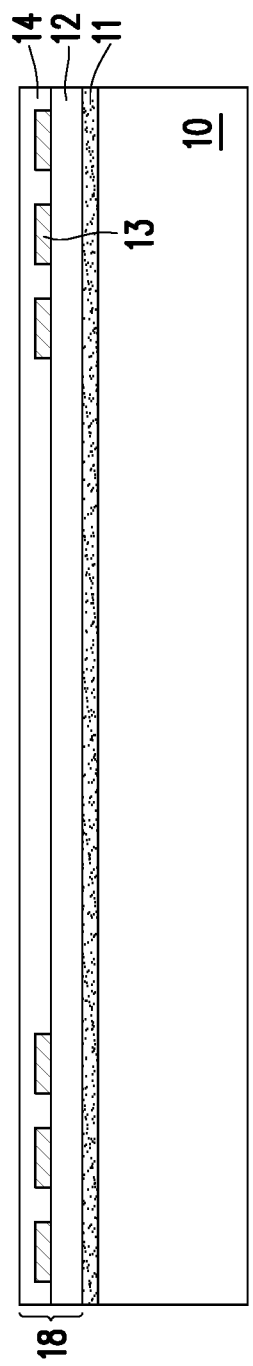

Referring to FIG. 1B, a second polymer layer 14 is formed on the first polymer layer 12 and the RDL 13, so as to cover the top surface of the first polymer layer 12, the top surface and the sidewalls of the RDL 13. In some embodiments, the second polymer layer 14 includes polybenzoxazole (PBO), polyimide (PI), benzocyclobutene (BCB), ajinomoto buildup gilm (ABF), solder resist film (SR), or the like, or a combination thereof, but the disclosure is not limited thereto. In some other embodiments, the second polymer layer 14 may be replaced by a dielectric layer. The dielectric layer may include a nitride such as silicon nitride, an oxide such as silicon oxide, an oxynitride such as silicon oxynitride, phosphosilicate glass (PSG), borosilicate glass (BSG), boron-doped phosphosilicate glass (BPSG), or the like, or a combination thereof. The second polymer layer 14 is formed by a suitable fabrication technique such as spin-coating, lamination, deposition, or the like. The material and the forming method of the second polymer layer 14 may be the same as or different from those of the first polymer layer 12.

Figure 1C:
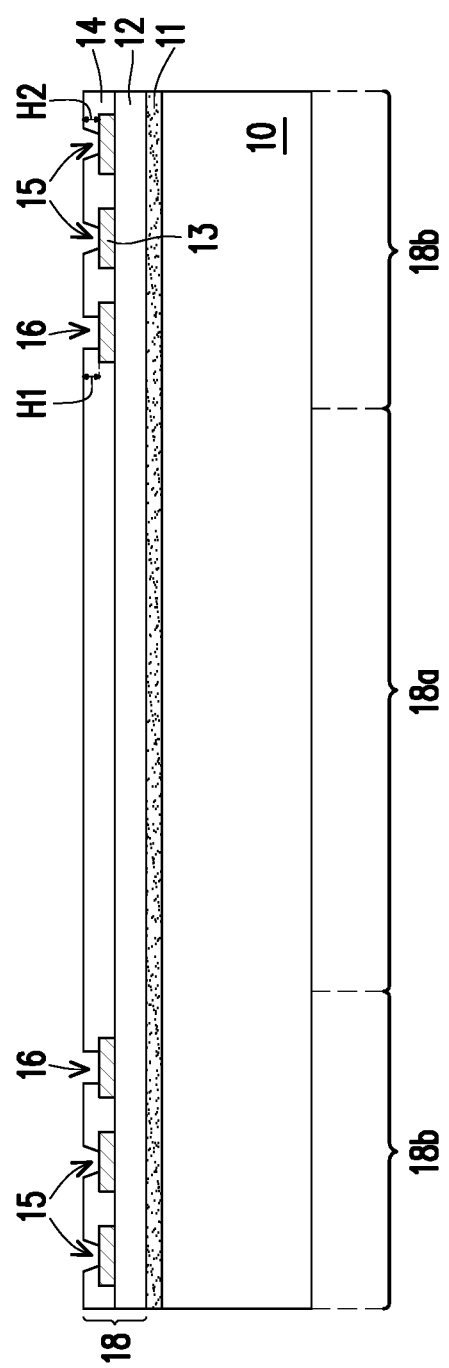

Referring to FIG. 1B and FIG. 1C, the second polymer layer 14 is patterned or partially removed to form a plurality of via holes 15 and at least one recess 16 in the second polymer layer 14. The removal method includes, for example, exposure and development processes, laser drilling process, photolithography and etching processes, or a combination thereof. The via holes 15 and the recess 16 may be formed simultaneously or successively. The via holes 15 expose a portion of the top surface of the RDL 13. The recess 16 may expose a portion of the top surface of the RDL 13, but the disclosure is not limited thereto. In some other embodiments, the recess 16 may not expose the RDL 13. In other words, the sidewalls of the recess 16 exposes the second polymer layer 14, and the bottom of the recess 16 may expose the second polymer layer 14 or/and the RDL 13. In some embodiments, the depth H1 of the recess 16 may less than, equal to, or larger than the depth H2 of the via hole 15. In some embodiments, the depth H2 may also be referred as the depth of the RDL 13, that is, the distance from the top surface of the second polymer layer 14 to the top surface of the RDL 13.

The cross section shapes of the via hole 15 and the recess 16 may be square, rectangle, inverted trapezoid, or other suitable shapes, respectively. The sidewalls of the via hole 15 and the recess 16 may be straight or inclined, respectively. The cross section shapes and sizes of the via hole 15 and the recess 16 may be the same or different.

In some embodiments, the first polymer layer 12, the RDL 13 and the second polymer layer 14 having the via holes 15 and the recess 16 form a RDL structure 18. The RDL structure 18 includes a die attaching region 18a and a periphery region 18b surrounding the die attaching region 18a.

In some embodiments, the recess 16 is closer to the die attaching region 18a than the via holes 15. In some embodiments, the via holes 15 is formed in the periphery region 18b, the recess 16 may be formed in the periphery region 18b, the die attaching region 18a, or a combination thereof. In some embodiments, the recess 16 may be a trench, a hole, or a combination thereof.

Figure 1D:
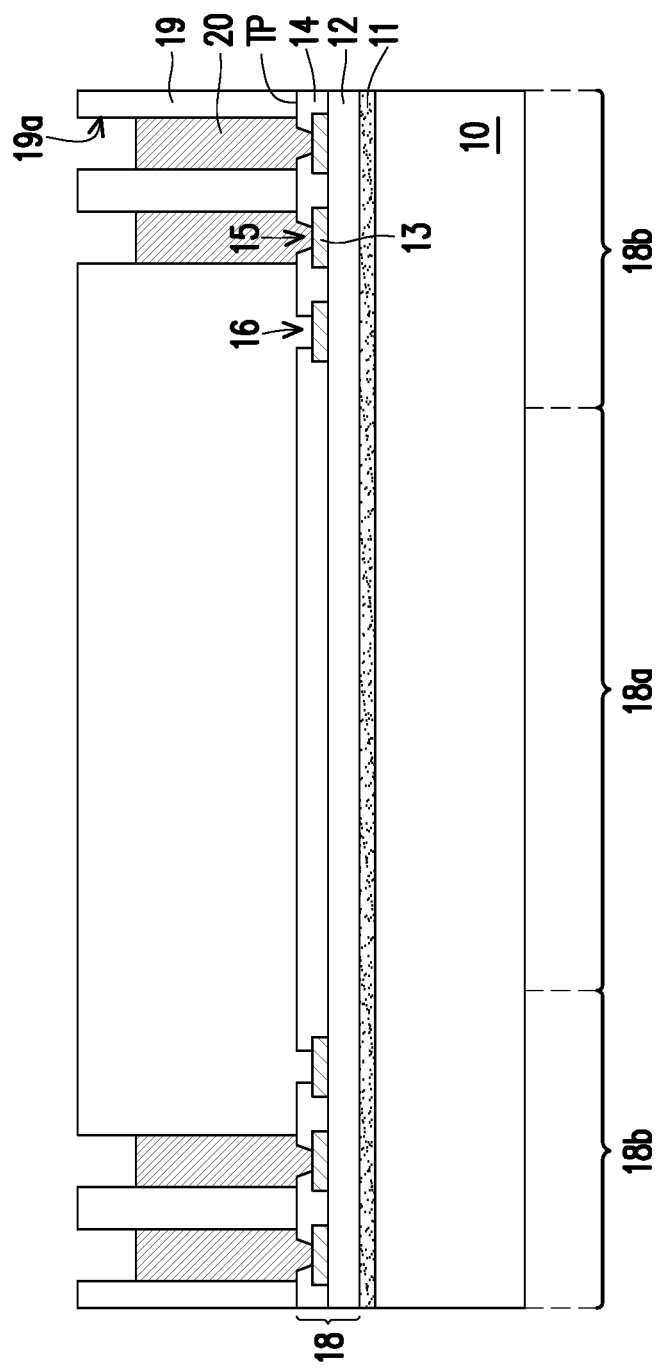
Figure 1E:
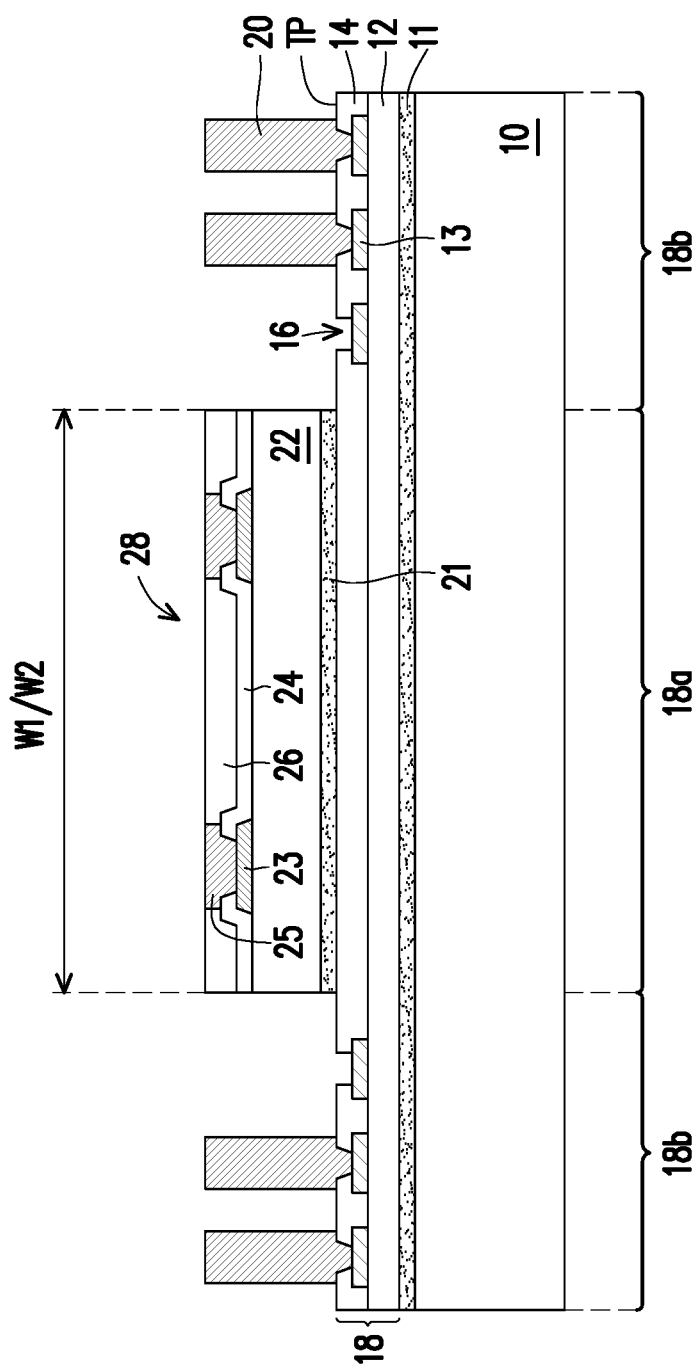

Referring to FIG. 1D and FIG. 1E, a patterned mask layer (such as patterned photoresist) 19 having a plurality of openings 19a is formed on the RDL structure 18. The patterned mask layer 19 may be a patterned photoresist. The patterned mask layer 19 covers a portion of the top surface of the second polymer layer 14 and fills into the recess 16. In other words, the die attaching region 18a, the recess 16, and a portion of the periphery region 18b of the RDL structure 18 is covered by the patterned mask layer 19. The opening 19a is located over and overlapped with the via hole 15, exposing a portion of the top surface of the second polymer layer 14, the sidewalls of the second polymer layer 14 and the top surface of the RDL 13 exposed in the via hole 15.

Thereafter, a plurality of through integrated fan-out vias (TIVs) 20 are formed on the RDL 13 and the second polymer layer 14 exposed by the opening 19a. The TIV 20 includes metal, metal alloy, metal compound, or a combination thereof. The patterned mask layer 19 is then stripped. The TIV 20 is electrically connected to the RDL 13.

In some embodiments, the TIV 20 includes a seed layer and a conductive layer formed on the seed layer. The seed layer is, for example, a titanium or/and copper composited layer, and is formed by a sputtering or a suitable technique. The seed layer is formed on the RDL structure 18 before the patterned mask layer 19 is formed. The conductive layer (e.g., a copper layer) is formed on the seed layer exposed by the openings 19a by plating, for example. Thereafter, the patterned mask layer 19 is stripped, the seed layer not covered by the conductive layer is removed. The conductive layer and the underlying seed layer form the TIV 20. In some embodiments, the sidewalls of the TIV 20 may be straight or inclined. The number of the TIVs 20 formed on RDL structure 18 shown in FIG. 1D is merely for illustration, and the disclosure is not limited thereto.

Referring to FIG. 1E, a die 28 is attached to the die attaching region 18a of the RDL structure 18. In some embodiments, the die 28 is one of a plurality of dies cut apart from a wafer, for example. The die 28 may be an application-specific integrated circuit (ASIC) chip, an analog chip, a sensor chip, a wireless and radio frequency chip, a voltage regulator chip or a memory chips. The number of the die 28 shown in FIG. 1E is merely for illustration, and the disclosure is not limited thereto. In some embodiments, two or more dies 28 may be mounted on the RDL structure 18, and the two or more dies 28 may be the same types of dies or the different types of dies.

Still referring to FIG. 1E, the die 28 is disposed between the TIVs 20, that is, the TIVs 20 are laterally aside or around the die 28. In some embodiments, the die 28 includes a substrate 22, a plurality of pads 23, a passivation layer 24, a plurality of connectors 25 and a passivation layer 26. The pads 23 may be a part of an interconnection structure (not shown) and electrically connected to the integrated circuit devices (not shown) formed on the substrate 22. The passivation layer 24 is formed over the substrate 22 and covers a portion of the pads 23. A portion of the pads 23 is exposed by the passivation layer 24 and serves as an external connection of the die 28. The connectors 25 are formed on and electrically connected to the pads 23 not covered by the passivation layer 24. The connector 25 includes solder bumps, gold bumps, copper bumps, copper posts, copper pillars, or the like. The passivation layer 26 is formed over the passivation layer 24 and aside the connectors 25 to cover the sidewalls of the connectors 25. The passivation layers 17 and 19 respectively include an insulating material such as silicon oxide, silicon nitride, polymer, or a combination thereof. The materials of the passivation layer 24 and the passivation layer 26 may be the same or different. In some embodiments, the top surface of the passivation layer 26 is substantially level with the top surface of the connectors 25.

In some embodiments, the die 28 is attached to the second polymer layer 14 of the RDL structure 18 through an adhesive layer 21 such as a die attach film (DAF), silver paste, or the like. The adhesive layer 21 is formed on the back side of the die 28. Herein, the back side refers to a side opposing the frond side (the side close to the connectors 25, that is, close to an active surface of the die 28) of the die 28.

In some embodiments, attaching the die 28 to the RDL structure 18 includes the following processes: forming an adhesive material layer on the back side of the die 28, the adhesive layer 21 may include a flowable material. The die 28 with the adhesive material layer is bonded to the second polymer layer 14 of the RDL structure 18. Thereafter, a curing process is performed, such that the adhesive material layer is cross-linked and cured to form the adhesive layer 21.

In some embodiments, the width W2 of the adhesive layer 21 is equal to the width W1 of the die 28, and the sidewall of the adhesive layer 21 may be aligned with the sidewall of the die 28, but the disclosure is not limited thereto. In some other embodiments, the width W2 of the adhesive layer 21 may be larger than the width W1 of the die 28, and the sidewall of the adhesive layer 21 is not aligned with the sidewall of the die 28.

Figure 1F:
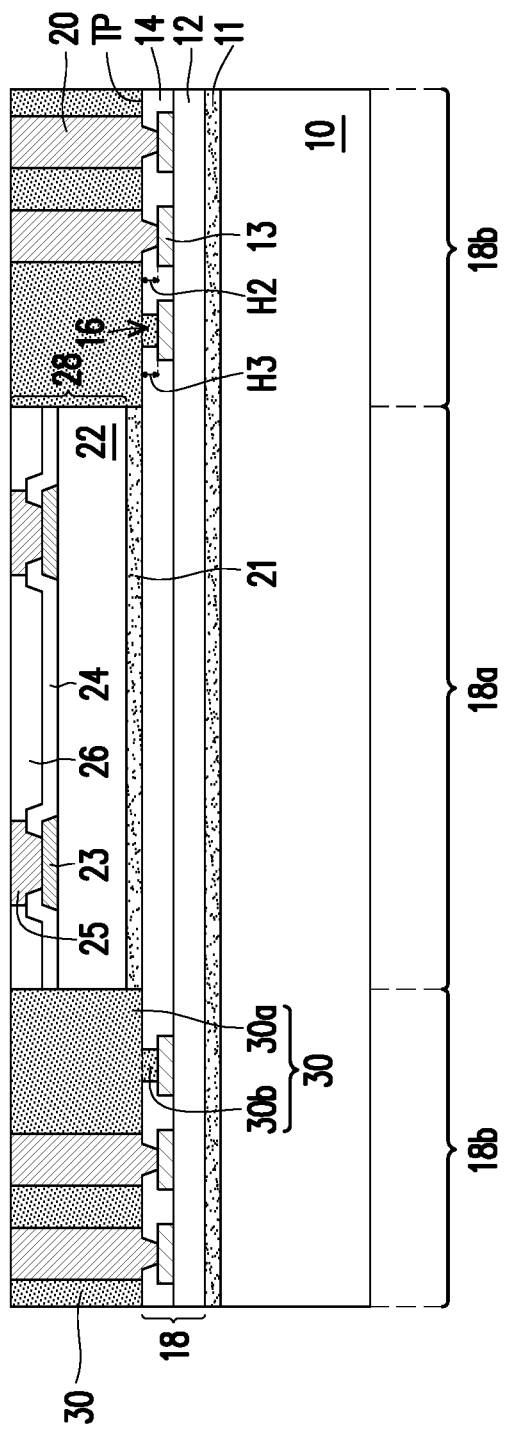

Referring to FIG. 1F, an encapsulant 30 is then formed on the RDL structure 18 to encapsulate the sidewalls of the die 28 and the TIVs 20. In some embodiments, the encapsulant 30 includes a molding compound, a molding underfill, a resin such as epoxy, a combination thereof, or the like. In some other embodiments, the encapsulant 30 includes a photo-sensitive material such as polybenzoxazole (PBO), polyimide, benzocyclobutene (BCB), a combination thereof, or the like, which may be easily patterned by exposure and development processes or laser drilling process. In alternative embodiments, the encapsulant 30 includes nitride such as silicon nitride, oxide such as silicon oxide, phosphosilicate glass (PSG), borosilicate glass (BSG), boron-doped phosphosilicate glass (BPSG), a combination thereof, or the like. The encapsulant 30 may be formed by the following process: forming an encapsulant material layer on the RDL structure 18, the die 28 and the TIVs 20 by a suitable fabrication technique such as spin-coating, lamination, deposition, or similar processes. The encapsulant material layer encapsulates the top surfaces and sidewalls of the die 28 and the TIVs 20. Thereafter, a planarization process such as a grinding or polishing process is performed to remove a portion of the encapsulant material layer, such that the top surfaces of the connectors 25 of the die 28 and the TIVs 20 are exposed. In some embodiments, the top surfaces of the die 28, the TIVs 20 and the encapsulant 30 are substantially coplanar with each other.

Referring to FIG. 1F, the encapsulant 30 covers the top surface of the RDL structure 18, the sidewalls of the die 28, the sidewalls of the adhesive layer 21 and the sidewalls of the TIVs 20. In some embodiments, the encapsulant 30 fills into the recess 16 of the second polymer layer 14 of the RDL structure 18. The encapsulant 30 covers and contacts with the inner surface of the recess 16. In some embodiments in which the recess 16 exposes the sidewall and the bottom surface of the second polymer layer 14 and a portion of the top surface of the RDL 13, the encapsulant 30 covers and contacts sidewalls of the second polymer layer 14 and the top surface of the RDL 13 exposed in the recess 16. In other words, the encapsulant 30 is engaged with the RDL structure 18, and a portion of the encapsulant 30 contacting with the second polymer layer 14 has a step profile.

In other words, the encapsulant 30 includes a body part 30a and an extending part 30b. The body part 30a is located on the top surface TP of the second polymer layer 14 of the RDL structure 18, encapsulating sidewalls of the die 28 and sidewalls of the TIV 20. The extending part 30b is located underlying the body part 30a and extends to be embedded in the second polymer layer 14.

In some embodiments, the extending part 30b is located on the RDL 13 and the second polymer layer 14 and laterally aside the second polymer layer 14, covering and contacting the sidewalls and bottom surface of the second polymer layer 14 or/and the top surface of the RDL 13 exposed by the recess 16. The extending part 30b is overlapped with a portion of the second polymer layer 14 in the direction parallel with the top surface TP of the RDL structure 18 or the top surface of the die 28. The bottom surface of the extending part 30b is lower than the bottom surface of the die 28, the bottom surface of the adhesive layer 21 and the top surface TP of the second polymer layer 14 of the RDL structure 18. In some embodiments in which the depth H1 (FIG. 1C) of the recess 16 is equal to the depth H2 (FIG. 1C) of the RDL 13, the bottom surface of the extending part 30b may be in contact with and coplanar with the top surface of the RDL 13, but the disclosure is not limited thereto. In some other embodiments in which the depth H1 of the recess 16 is less than the depth H2 of the RDL 13, the bottom surface of the extending part 30b may be higher than the top surface of the RDL 13 (not shown).

As the encapsulant 30 includes an extending part 30b extends to be embedded in the second polymer layer 14, the contact area between the encapsulant 30 and the second polymer layer 14 is increased. In some embodiments, the bottom surface of the body part 30a, the bottom surface and sidewalls of the extending part 30b are in contact with second polymer layer 14. That is to say, the contact area between the encapsulant 30 and the second polymer layer 14 is larger than the bottom surface of encapsulant 30 (extending in a direction parallel with the top surface of the die 28 or the top surface of the RDL structure 18). The cross section shape of the extending part 30b may be square, rectangle, inverted trapezoid, or the like. The height H3 of the extending part 30b may be less than or equal to the depth H2 of the RDL 13. However, the disclosure is not limited thereto, the extending part 30b may have any shape or height, as long as it extends into the second polymer layer 14 or/and the first polymer layer 12 and the contact area between the encapsulant 30 and the second/first polymer layer(s) 14/12 is increased.

Figure 1G:
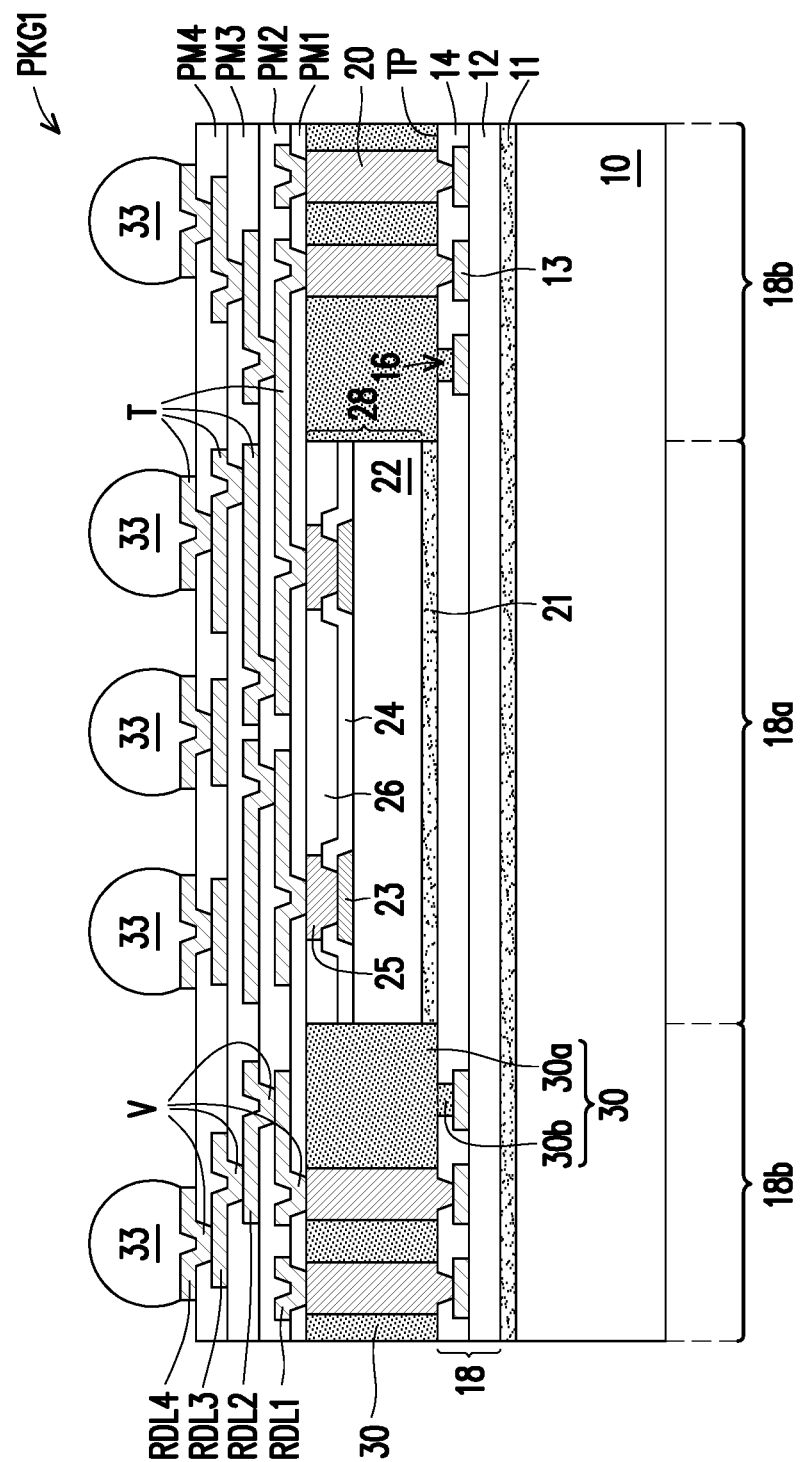

Referring to FIG. 1G, a redistribution layer (RDL) structure 32 is formed over and electrically connected to the die 28 and the TIVs 20. The RDL structure 32 is referred to as a "front-side redistribution layer structure" through the specification, wherein the "front-side" refers to a side close to the connectors 25 of the die 28. In some embodiments, the RDL structure 32 includes a plurality of third polymer layers PM1, PM2, PM3 and PM4 and a plurality of redistribution layers RDL1, RDL2, RDL3 and RDL4 stacked alternately. The number of the polymer layers or the redistribution layers shown in FIG. 1G is merely for illustration, and the disclosure is not limited thereto.

The third polymer layer PM1 is located on and in contact with the top surface of the die 28, the top surface of the encapsulant 30 and a portion of the top surface of the TIV 20. In some embodiment, the encapsulant 30 is not extending into the second polymer layer 14, the contact area between the third polymer layer PM1 and the encapsulant 30 is less than the contact area between the second polymer layer 14 and the encapsulant 30.

The redistribution layer RDL1 penetrates through the third polymer layer PM1 and is electrically connected to the connectors 25 of the die 28 and the TIVs 20. The redistribution layer RDL2 penetrates through the third polymer layer PM2 and is electrically connected to the redistribution layer RDL1. The redistribution layer RDL3 penetrates through the third polymer layer PM3 and is electrically connected to the redistribution layer RDL2. The redistribution layer RDL4 penetrates through the third polymer layer PM4 and is electrically connected to the redistribution layer RDL3.

In some embodiments, each of the third polymer layers PM1, PM2, PM3 and PM4 includes a photo-sensitive material such as polybenzoxazole (PBO), polyimide (PI), benzocyclobutene (BCB), a combination thereof or the like. In some embodiments, each of the redistribution layers RDL1, RDL2, RDL3 and RDL4 includes conductive materials. The conductive materials includes metal such as copper, aluminum, nickel, titanium, alloys thereof, a combination thereof or the like, and is formed by an electroplating process. In some embodiments, the redistribution layers RDL1, RDL2, RDL3 and RDL4 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals.

In some embodiments, the redistribution layers RDL1, RDL1, RDL3 and RDL 4 respectively includes a plurality of vias V and a plurality of traces T connected to each other. The vias V penetrate through the third polymer layers PM1, PM2, PM3 and PM4 to connect the traces T of the redistribution layers RDL1, RDL1, RDL3 and RDL4, and the traces T are respectively located on the third polymer layers PM1, PM2, PM3 and PM4, and are respectively extending on the top surface of the third polymer layers PM1, PM2, PM3 and PM4.

In some embodiments, the topmost redistribution layer RDL4 is also referred as under-ball metallurgy (UBM) layer for ball mounting. Thereafter, a plurality of connectors 33 are formed over and electrically connected to the redistribution layer RDL4 of the RDL structure 32. In some embodiments, the connectors 33 are made of a conductive material with low resistivity, such as Sn, Pb, Ag, Cu, Ni, Bi or an alloy thereof, and are formed by a suitable process such as evaporation, plating, ball drop, or screen printing. In alternative embodiments, the connectors 33 may be controlled collapse chip connection (i.e. C4) bumps formed by a C4 process. In some embodiments, the connectors 33 are also referred as conductive terminals. The connectors 33 are electrically connected to the die 28 through the RDL structure 32, and electrically connected to the RDL structure 18 through the RDL structure 32 and the TIVs 20.

Figure 1H:
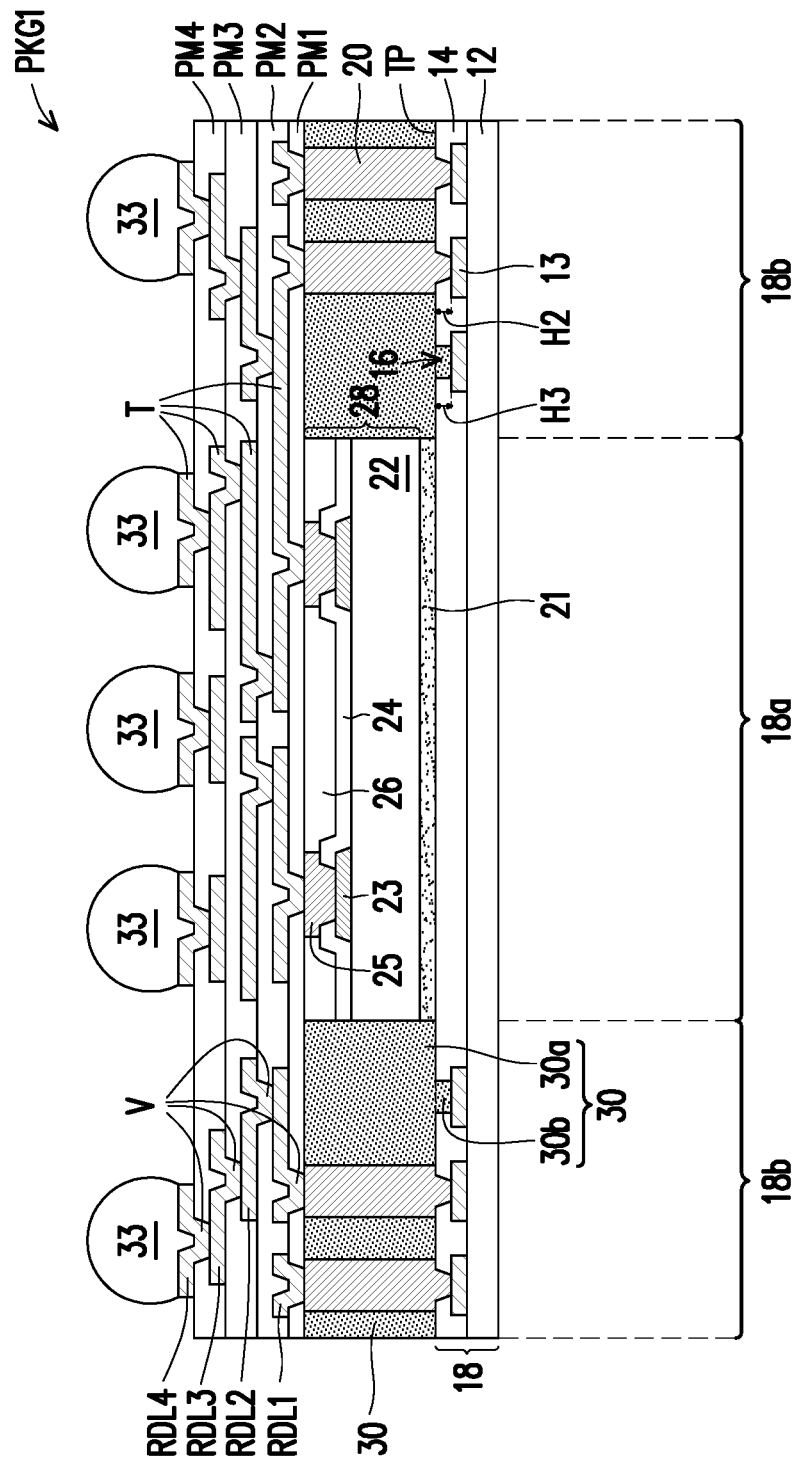

Referring to FIG. 1G and FIG. 1H, thereafter, the release layer 11 is decomposed under the heat of light, and the carrier 10 is then de-bonded from the overlying structure. And the package structure PKG1 is thus completed.

Referring to FIG. 1H, the package structure PKG1 includes the die 28, the encapsulant 30, the TIVs 20, the RDL structure 18, the RDL structure 32 and the connectors 33. In some embodiments, the RDL structure 18 is formed at back side of the die 28, the RDL structure 32 is formed at front side of the die 28. The encapsulant 30 is between the RDL structure 18 and the RDL structure 32, laterally surrounding sidewalls of the die 28 and the TIVs 20. In some embodiments, the encapsulant 30 comprises the extending part 30 embedded in the RDL structure 18. The extending part 30 fills in the recess 16 of the second polymer layer 14. The height H3 of the extending part 30b may be equal to the depth H2 of the RDL 13, and a portion of the top surface of the RDL 13 may be exposed in the bottom of the recess 16 and is in contact with the extending part 30. However, the disclosure is not limited thereto.

FIG. 2A to FIG. 2D are schematic cross-sectional views respectively illustrating a package structure according to some embodiments of the disclosure. The package structures shown in FIGS. 2A to 2D are similar to the package structure PKG1 shown in FIG. 1H, except the extending part of the encapsulant or/and the adhesive layer may have different structural features which are described as below. For the sake of brevity, the similar features, materials and the forming methods are not described again.

Figure 2A:
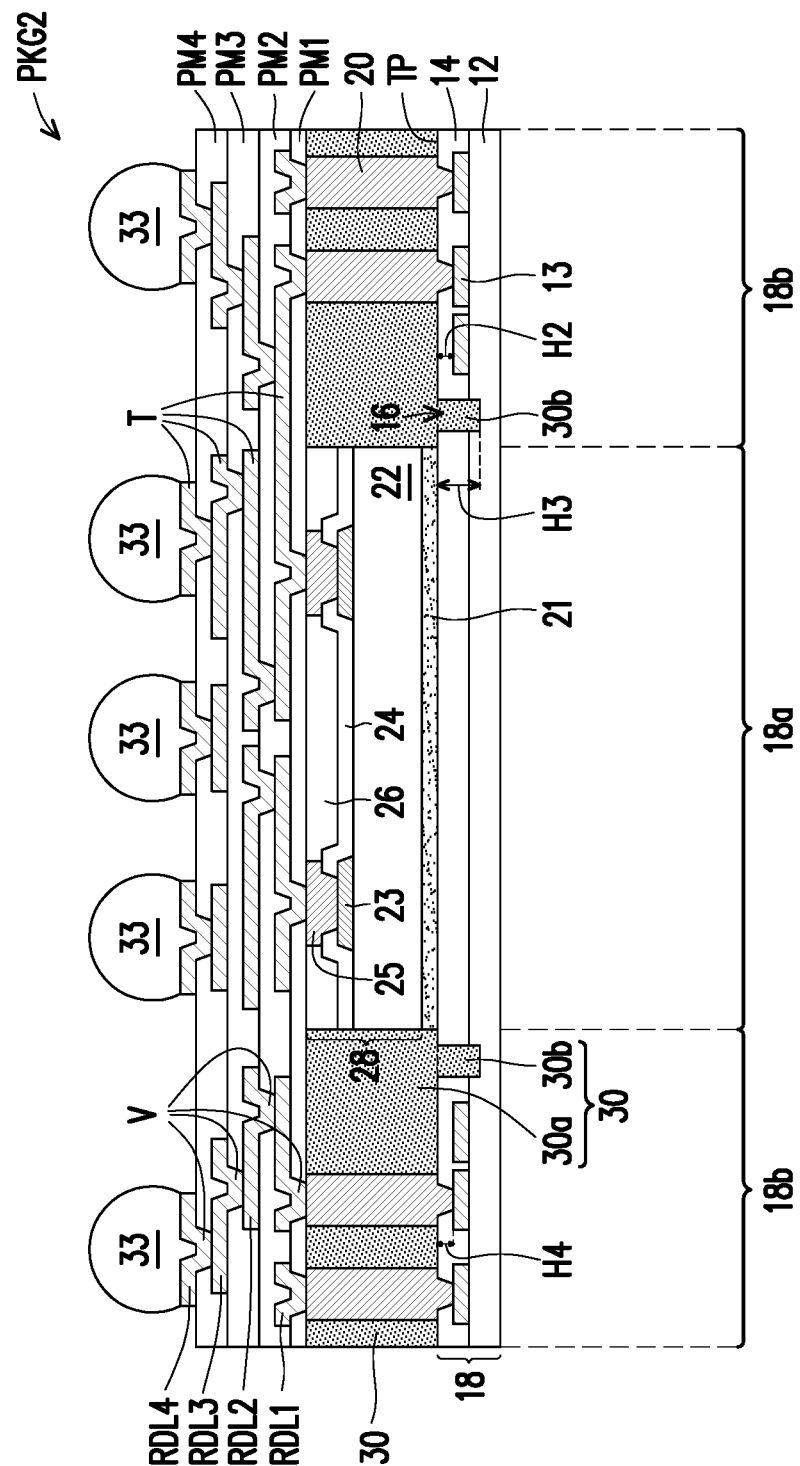
FIG. 2A to FIG. 2E are schematic cross-sectional views of package structures according to some embodiments of the disclosure.

Referring to FIG. 2A, in some embodiments, in package structure PKG2, the recess 16 may not expose the RDL 13, and the extending part 30b of the encapsulant 30 filled in the recess 16 is not in contact with the RDL 13. The depth of the recess 16 and the height H3 of the extending part 30b may be less than, equal to, or larger than the depth H2 of the RDL 13. The bottom surface of the extending part 30b may be higher than, coplanar with or lower than the top surface of the RDL 13 or/and the bottom surface of the TIV 20.

In some embodiments, the depth of the recess 16 is larger than the thickness of the second polymer layer 14, that is, the recess 16 is formed in the second polymer layer 14 and the first polymer layer 12. The bottom of the recess 16 exposes the first polymer layer 12, the sidewalls of the recess 16 exposes the second polymer layer 14 and the first polymer layer 12. The height H3 of the extending part 30b is larger than the thickness of the second polymer layer 14, and the bottom surface of the extending part 30b is lower than the bottom surface of the RDL 13 and the top surface of the first polymer layer 12. That is, the extending part 30b further extends to be embedded in the first polymer layer 12.

The bottom surface of the body part 30a is in contact with the second polymer layer 14. The sidewalls of the extending part 30b are in contact with the second polymer layer 14 and the first polymer layer 12. The bottom surface of the extending part 30b is in contact with the first polymer layer 12. Therefore, the contact area between the encapsulant 30 and the second/first polymer layers 14/12 of the RDL structure 18 is larger than the bottom surface of the encapsulant 30.

Figure 2B:
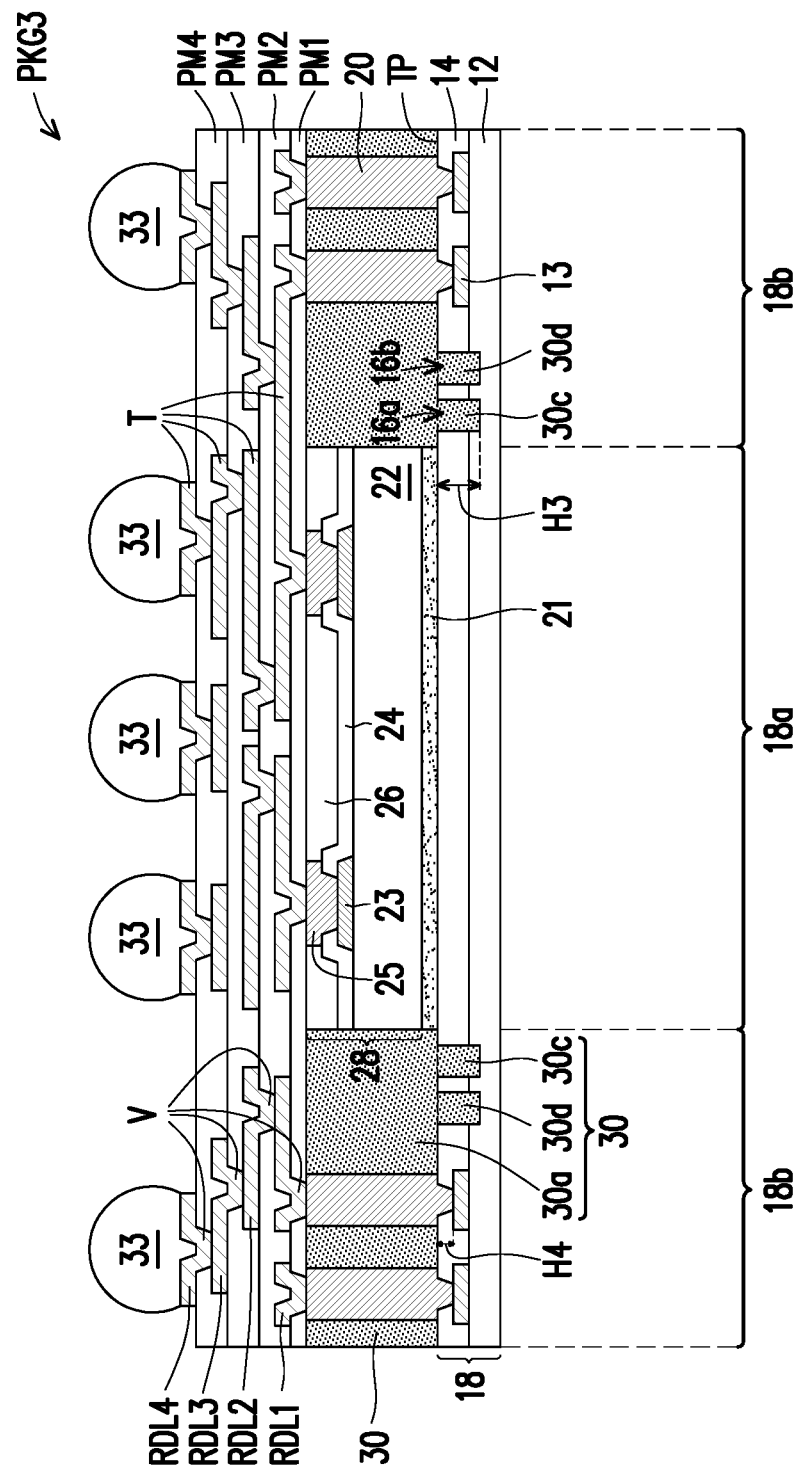

Referring to FIG. 2B, in some embodiments, in package structure PKG3, two recesses 16a and 16b are formed in the second polymer layer 14 or/and the first polymer layer 12. In some embodiments, the two recesses 16a and 16b are formed in the periphery region 18b of the RDL structure 18. Each of the recess 16a and 16b may have structural features similar to those of the recess 16 in foregoing embodiments. The recess 16a and the recess 16b may have the same or different shapes or sizes. The encapsulant 30 fills into the two recesses 16a and 16b. The encapsulant 30 includes two extending parts 30c and 30d underlying the body part 30a thereof. The extending part 30c fills into the recess 16a, and the extending part 30d fills into the recess 16b. The extending parts 30c and 30d are located in the periphery region 18b of the RDL structure 18. In some embodiments, the extending parts 30c and 30d are located between the TIVs 20 and the die 18. The extending parts 30c and 30d may respectively similar to the extending part 30b described in the foregoing embodiments. The shapes, sizes and structural features of the extending parts 30c and 30d may be the same or different.

Figure 2C:
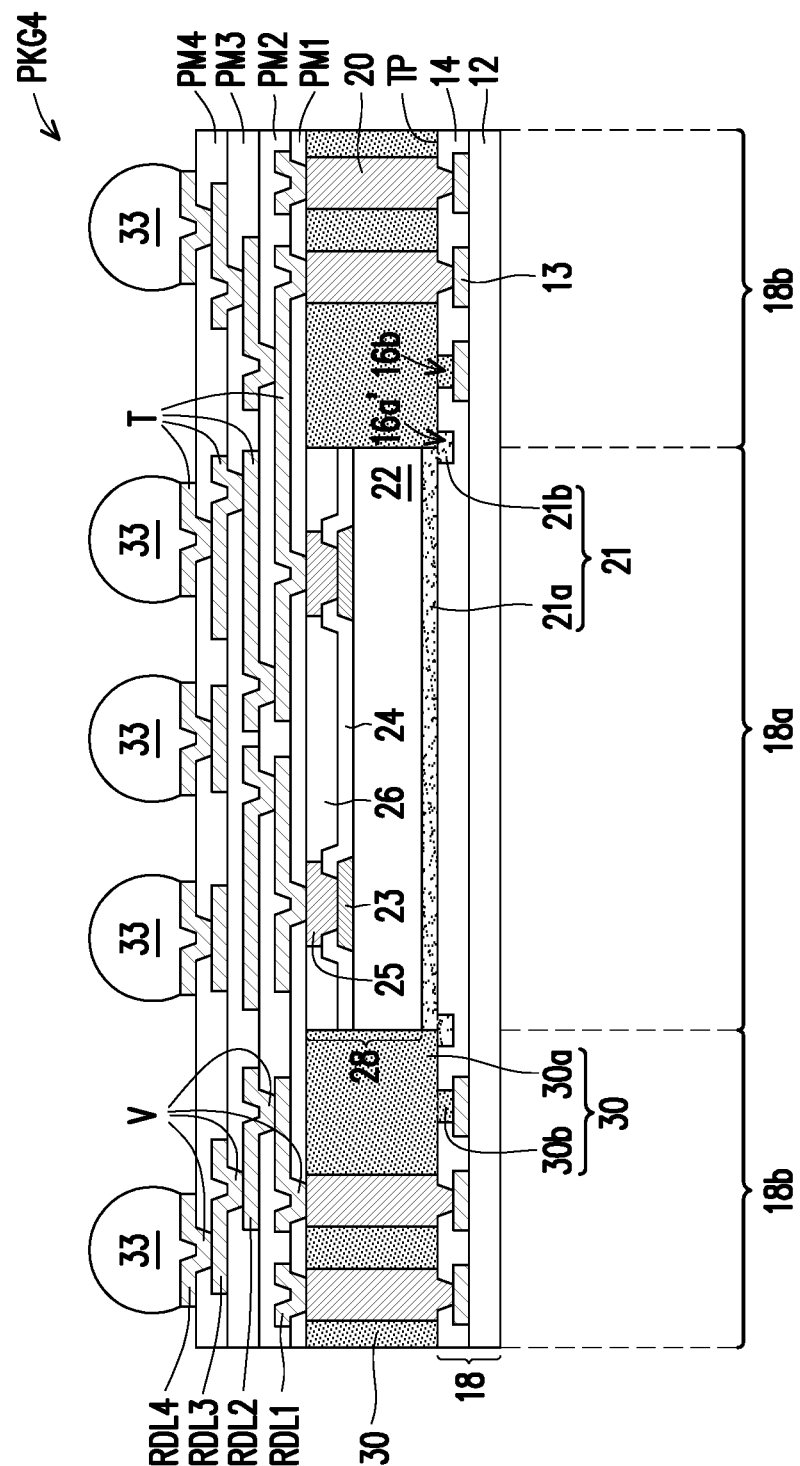

Referring to FIG. 2C, in some embodiments, in package structure PKG4, two recesses 16a' and 16b may be formed in the RDL structure 18. The recess 16b is formed in the periphery region 18b, and the recess 16a' is formed in the periphery region 18b and the die attaching region 18a. In other words, the recess 16a' is across the boundary between the die attaching region 18a and the periphery region 18b. In some embodiments, the recesses 16*a*' and 16*b* may be formed in the second polymer layer 14, respectively, but the disclosure is not limited thereto. The recess 16*a*' and the recess 16*b* may or may not expose the RDL 13 of the RDL structure 18, respectively. The shapes, sizes of the recesses 16*a*' and 16*b* may be the same or different. Referring to FIG. 1E and FIG. 2C, during the process of attaching the die 18 to the RDL structure 18, the adhesive layer 21 fills into the recess 16*a*'. In some embodiments, the recess 16*a*' is filled up with the adhesive layer 21. The recess 16*b* is filled with the extending part 30*b* of the encapsulant 30.

The adhesive layer 21 includes a body part 21*a* and an embedded part 21*b* connected to each other. In some embodiments, the embedded part 21*b* is under the ends of the body part 21*a*. The encapsulant 30 includes a body part 30*a* and an extending part 30*b* under the body part 30*a*. In some embodiments, the bottom surfaces of the body part 21*a* of the adhesive layer 21 and the body part 30*a* of the encapsulant 30 are substantially coplanar with the top surface TP of the second polymer layer 14. The bottom surface of the embedded part 21*b* of the adhesive layer 21 and the bottom surface of the extending part 30*b* are lower than the top surface TP of the second polymer layer 14.

In some embodiments in which the recesses 16*a*' is formed in the second polymer layer 14, the bottom surface of the body part 21*a*, the bottom surface of the embedded part 21*b* and the sidewalls of the embedded part 21*b* are in contact with the second polymer layer 14. That is to say, the contact area between the adhesive layer 21 and the second polymer layer 14 of the RDL structure 18 is larger than the area of the bottom surface of the adhesive layer 21 (extending in a direction parallel with the top surface of the die 28 or the top surface of the RDL structure 18). Further, the contact area between the adhesive layer 21 and the second polymer layer 14 of the RDL structure 18 is larger than the contact area between the adhesive layer 21 and the die 28.

The embedded part 21*b* may have similar structural feature to the extending part of the encapsulant 30 described above. The shapes, sizes of the embedded part 21*b* of the adhesive layer 21 and the extending part 30*b* of the encapsulant 30 may be the same or different. The embedded part 21*b* is located in the RDL structure 18, and laterally aside the second polymer layer 14 or/and the first polymer layer 12. In some embodiments, the embedded part 21*b* is not in contact with the RDL 13, but the disclosure is not limited thereto. In some other embodiments in which the recess 16*a*' exposes the RDL 13, the embedded part 21*b* may be in contact with the RDL 13 (not shown). In some embodiments, the sidewall of the body part 21*a* is align with the sidewall of the die 28, and the sidewall of the embedded part 21*b* is not align with the sidewall of the die 18 or the sidewall of the body part 21*a*. In some embodiments, the embedded part 21*b* protrudes from the sidewalls of the die 18 and the body part 21*a* in a direction parallel with the top surface of the die 18. However, the disclosure is not limited thereto. In some other embodiments, one sidewall of the embedded part 21*b* may be align with the sidewall of the die 28 and the sidewall of the body part 21*a* of the adhesive layer 21.

In some embodiments, a portion of the embedded part 21*b* is covered by the body part 21*a* of the adhesive layer 21, and another portion of the embedded part 21*b* is covered by the body part 30*a* of the encapsulant 30. In other words, a portion of the adhesive layer 21 overlaps a portion of the encapsulant 30*a* in the direction perpendicular to the top surface of the die 28 or the RDL structure 18.

In some embodiments, the top surface of the embedded part 21*b* of the adhesive layer 21, the top surface of the extending part 30*b* of the encapsulant are coplanar with the top surface of the second polymer layer 14 of the RDL structure 18. The bottom surfaces of the embedded part 21*b* and the extending part 30*b* are lower than the bottom surface of the die 28, the bottom surface of the body part 21*a* of the adhesive layer 21 and the bottom surface of the body part 30*a* of the encapsulant 30. The bottom surface of the embedded part 21*b* and the bottom surface of the extending part 30*b* may be in the same level or different levels. The embedded part 21*b* and the extending part 30*b* may respectively contact or not contact with the RDL 13.

In some embodiments, the recess 16*a*' and the 16*b* are spaced from each other. The embedded part 21*b* of the adhesive layer 21 and the extending part 30*b* of the encapsulant 30 are spaced from each other by the second polymer layer 14 therebetween. That is, a portion of the second polymer layer 14 is located between the embedded part 21*b* of the adhesive layer 21 and the extending part 30*b* of the encapsulant 30. In other words, the embedded part 21*b* of the adhesive layer 21, the extending part 30*b* of the encapsulant 30, a portion of the second polymer layer 14 are overlapped with each other in the direction parallel with the top surface of the RDL structure 18 or the top surface of the die 28.

As illustrated is FIG. 2C, the depths of the recesses 16*a*' and 16*b* are less than the thickness of the second polymer layer 14, and the recesses 16*a*' and 16*b* are formed in the second polymer layer 14, but the disclosure is not limited thereto. In some other embodiments, the depth of the recesses 16*a*' and 16*b* may be larger than the thickness of the second polymer layer 14, respectively, and the recesses 16*a*' and 16*b* may be formed in the second polymer layer 14 and the first polymer layer 12, respectively. That is, the extending part 30*b* of the encapsulant 30 may extend into the second polymer layer 14 and the first polymer layer 12.

Figure 2D:
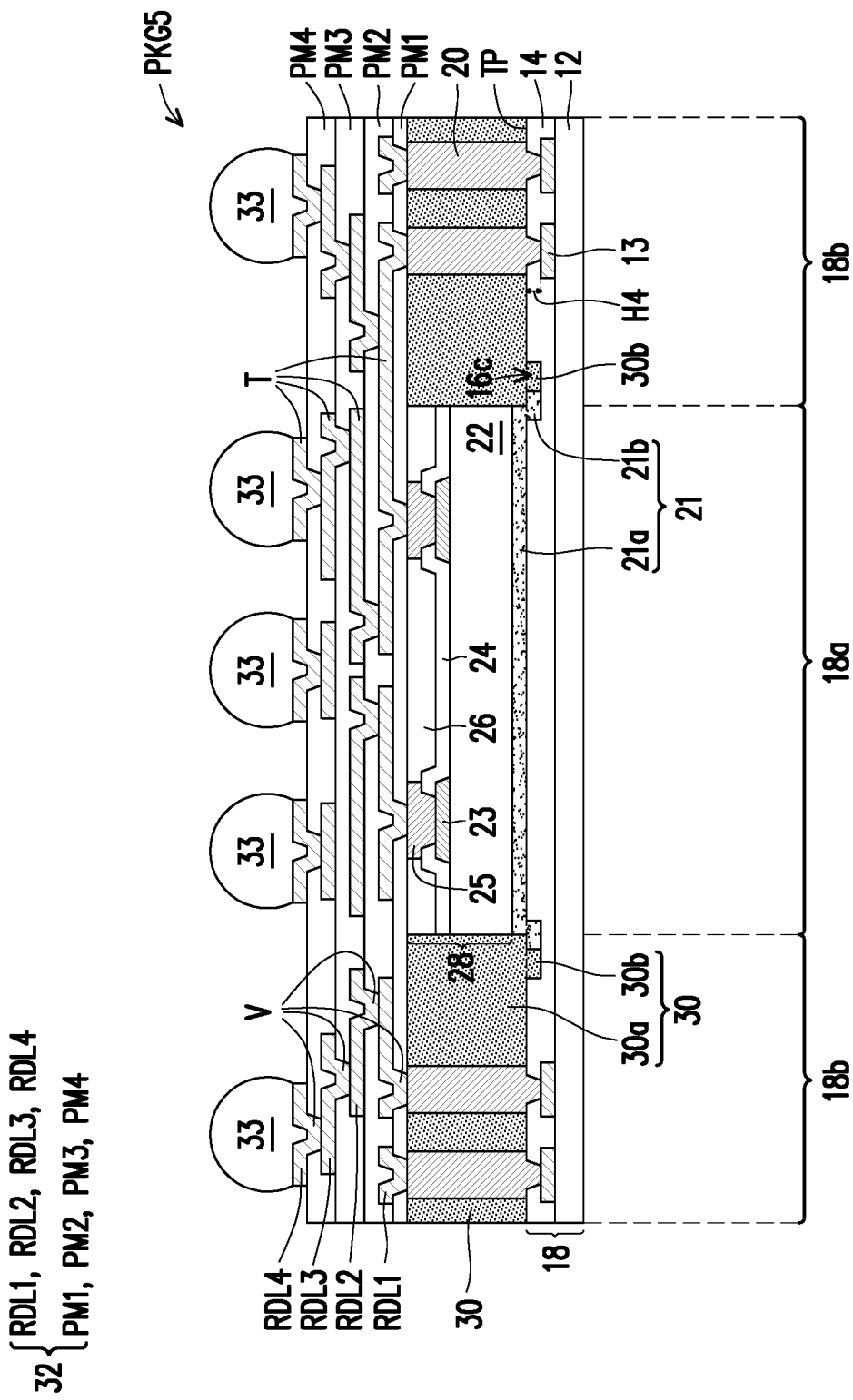

Referring to FIG. 2D, in some embodiments, in package structure PKG5, a recess 16*c* is formed in the die attaching region 18*a* and the periphery region 18*b* of the RDL structure 18. A portion of the recess 16*c* is filled with the adhesive layer 21, and another portion of the recess 16*c* is filled with encapsulant 30. In other words, the adhesive layer 21 includes the body part 21*a* and the embedded part 21*b*. The encapsulant 30 includes the body part 30*a* and the extending part 30*b*. The structural features of the embedded part 21*b* and the extending part 30*b* are similar to those described in FIG. 2C, except the embedded part 21*b* and the extending part 30*b* are located in the same recess 16*c*. In other words, the recess 16*c* in which the embedded part 21*b* is filled and the recess 16*c* in which the extending part 30*b* is filled are in spatial communication with each other.

In some embodiments, the embedded part 21*b* fills a portion of the recess 16*c*, and the encapsulant 30 fills another portion of the recess 16*c* not filled by the embedded part 21*b*. The embedded part 21*b* of the adhesive layer 21 and the extending part 30*b* of the encapsulant 30 are in contact with each other and laterally aside each other. The bottom surface of the embedded part 21*b* and the bottom surface of the extending part 30*b* are substantially coplanar with each other. The interface between the embedded part 21*b* of the adhesive layer 21 and the extending part 30*b* of the encapsulant 30 may be not align with the sidewall of the die 28 or the sidewall of the body part 21*a* of the adhesive layer 21, but the disclosure is not limited thereto. In some other embodiments, the interface between the embedded part 21*b* of the adhesive layer 21 and the extending part 30*b* of the encapsulant 30 may be align with the sidewall of the die 28 or the sidewall of the body part 21a of the adhesive layer 21. In some embodiments, the cross section shapes of the embedded part 21b and the extending part 30b may be square, rectangle, trapezoid, or inverted trapezoid or the like.

Figure 2E:
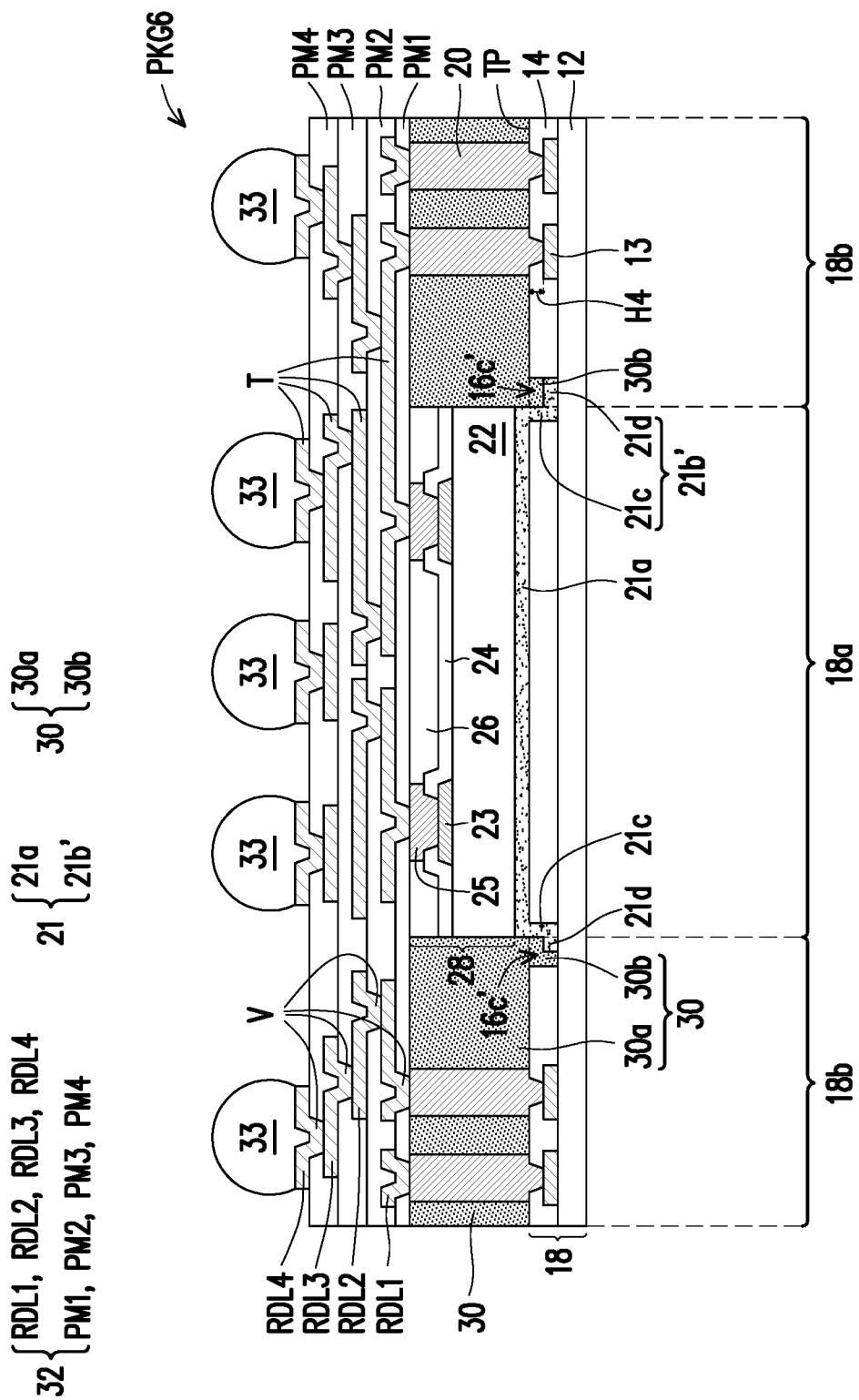

Referring to FIG. 2E, in some embodiments, in package structure PKG6, a recess 16c' is formed in the die attaching region 18a and the periphery region 18b of the RDL structure 18. That is, the recess 16c' is across the boundary of the die attaching region 18a and the periphery region 18b. The recess 16c' is formed in the second polymer layer 14 or/and the first polymer layer 12 of the RDL structure 18. The recess 16c' is filled with the adhesive layer 21 and the encapsulant 30. The adhesive layer 21 includes a body part 21a and an embedded part 21b'. The encapsulant 30 includes a body part 30a and an extending part 30b. In some embodiments, the embedded part 21b' of the adhesive layer 21 fills a portion of the recess 16c', and the cross section shape of the embedded part 21b' of the adhesive layer 21 may be L-shaped. The extending part 30b of the encapsulant 30 fills another portion of the recess 16c' not filled by the embedded part 21b', the cross-section shape of the extending part 30b may be square, rectangle, inverted L-shaped, or the like.

In some embodiments, the embedded part 21b' of the adhesive layer 21 includes a vertical portion 21c and a horizontal portion 21d connected to each other. The vertical portion 21c of the embedded part 21b' extends along a direction parallel with the sidewall of the die 28, and the horizontal portion 21d extends along a direction parallel with the top surface of die 28. In some embodiments, at least a portion of the vertical portion 21c is located in the die attaching region 18a of the RDL structure 18. A first sidewall of the vertical portion 21c contacts the sidewall of the second polymer layer 14 or/and the first polymer layer 12 exposed by the recess 16c' in the die attaching region 18a. The second sidewall opposing the first sidewall of the vertical portion 21c may be aligned with the sidewall of the body part 21c or the sidewall of the die 28, but the disclosure is not limited thereto. In some other embodiments, the second sidewall of the vertical portion 21c may be not aligned with the sidewall of the body part 21c or the sidewall of the die 28.

The horizontal portion 21d of the embedded part 21b' is laterally aside the vertical portion 21c and covers a portion of the bottom surface of the recess 16c'. In some embodiments, the horizontal portion 21d extends to contact the sidewall of the second polymer layer 14 or/and the first polymer layer 12 exposed by the recess 16c' in periphery region 18b, but the disclosure is not limited thereto. In some other embodiments, the horizontal portion 21d may not extend to contact the sidewall of the second polymer layer 14 or/and the first polymer layer 12.

The extending part 30b of the encapsulant 30 is located on the horizontal portion 21d of the embedded part 21b' of the adhesive layer 21 and laterally aside the vertical portion 21c of the embedded part 21b' of the adhesive layer 21. In some embodiments in which the horizontal portion 21d extend to contact the sidewall of the second polymer layer 14 or/and the first polymer layer 12, the extending part 30b contacts the top surface of the horizontal portion 30b, a portion of the sidewall of the vertical portion 21c and a portion of the sidewall of the second polymer layer 14 or/and the first polymer layer 12. In some other embodiments in which the horizontal portion 21d does not extend to contact the sidewall of the second polymer layer 14 or/and the first polymer layer 12, the extending part 30b covers a portion of the sidewall of the vertical portion 21c, the top surface and the sidewall of the horizontal portion 21d and the sidewall of the second polymer layer 14 or/and the first polymer layer 12.

It is noted that the shapes of the embedded part 21b' and the extending part 30b shown FIG. 2D and FIG. 2E are merely for illustration, and the disclosure is not limited thereto. The embedded part 21b' of the adhesive layer 21 and the extending part 30b of the encapsulant 30 may have any shape, as long as the embedded part 21b' and the extending part 30b fills in the recess 16c'.

Figure 3A:
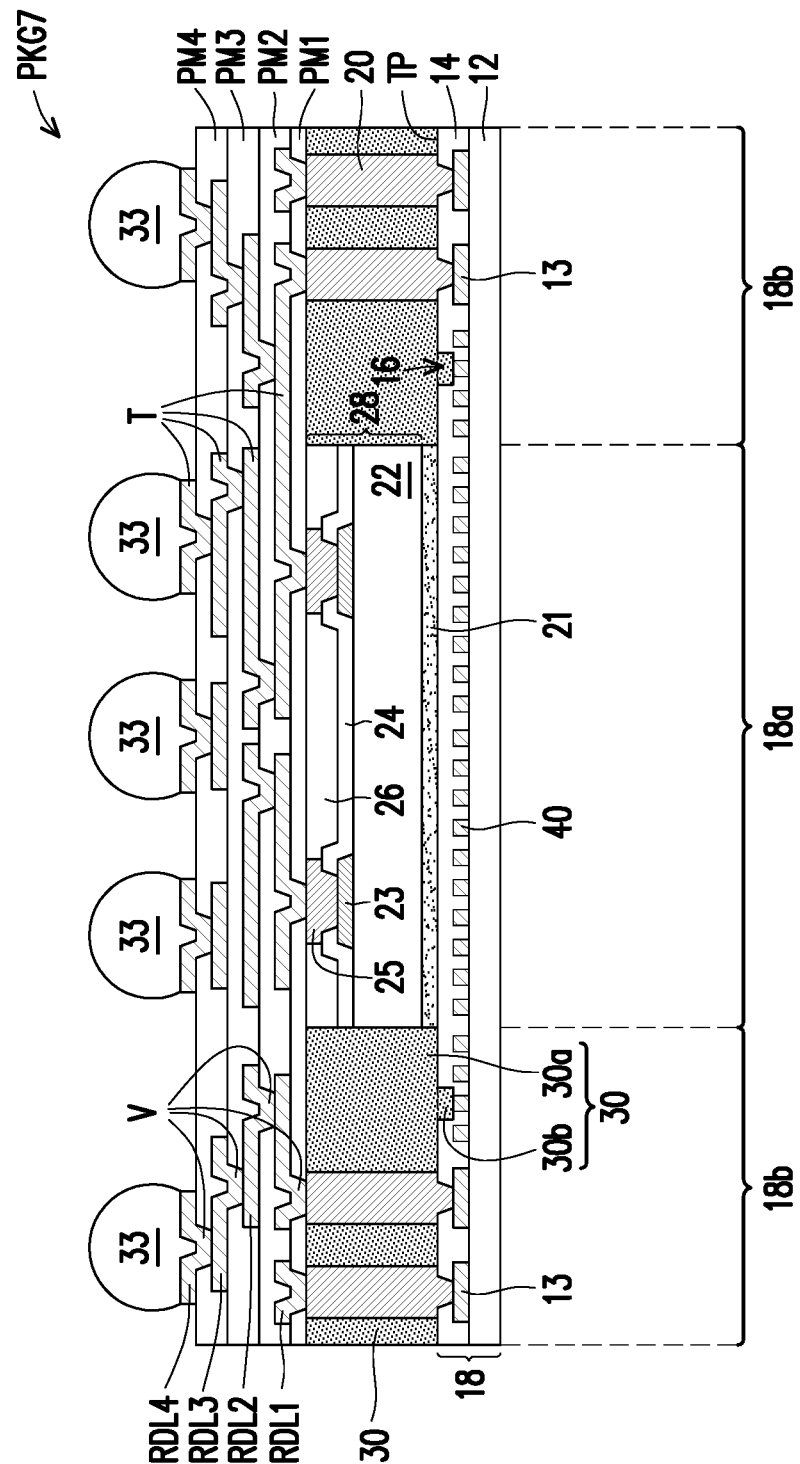
FIG. 3A to FIG. 3C are schematic cross-sectional views of package structures according to some embodiments of the disclosure.
Figure 3B:
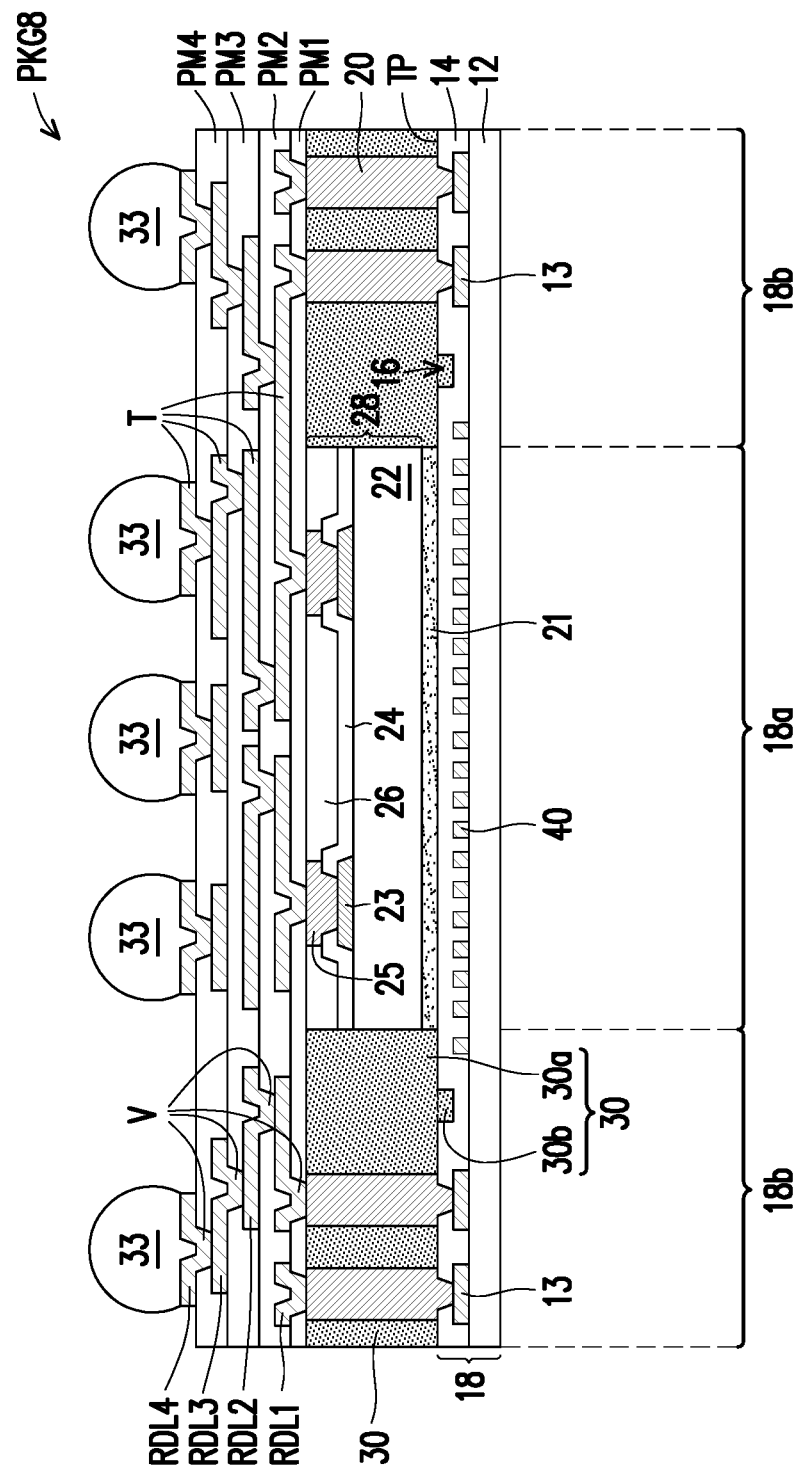
Figure 3C:
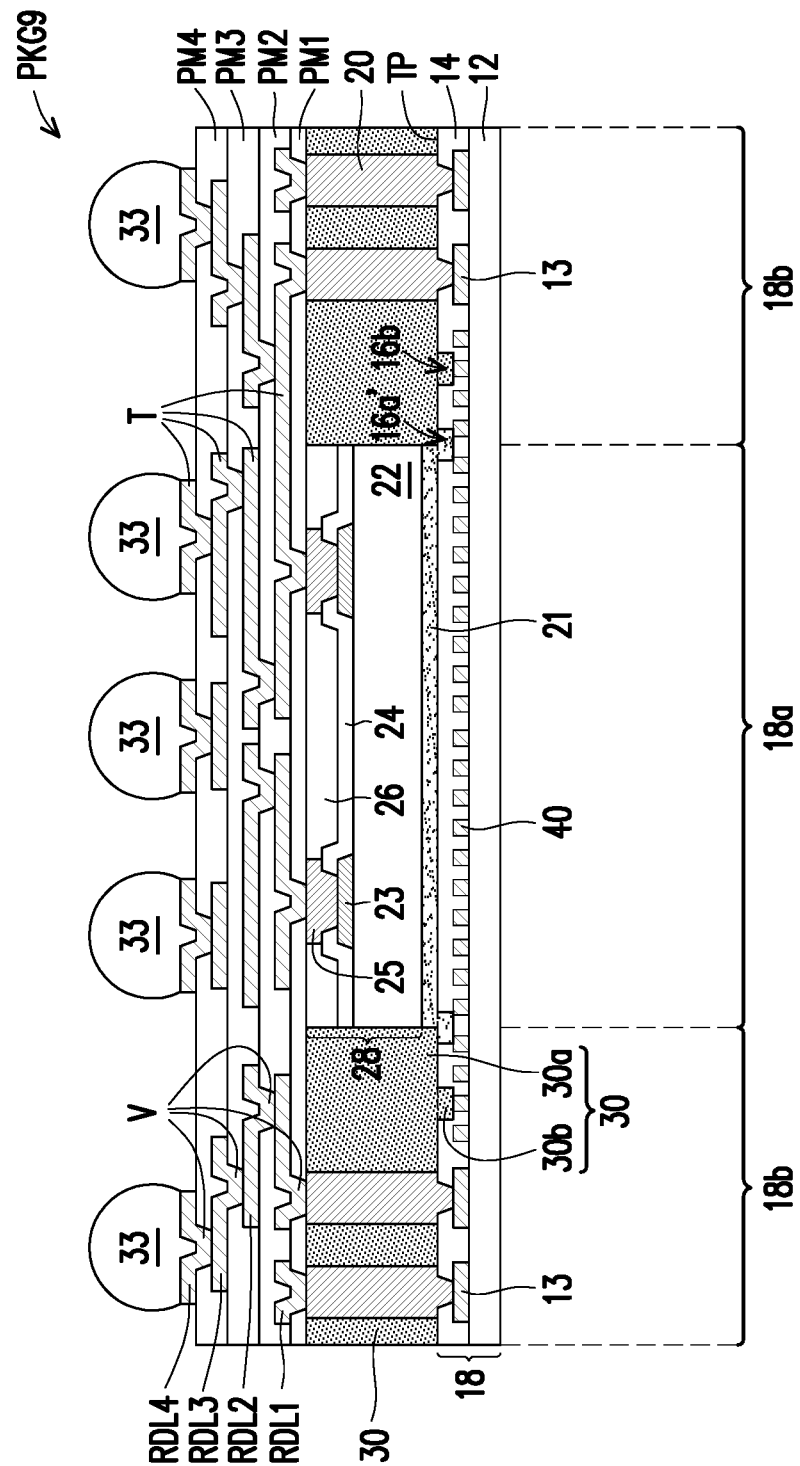

FIG. 3A to FIG. 3C illustrates examples of package structures including dummy RDLs in the RDL structure.

Referring to FIG. 3A, in some embodiments, in package structure PKG7, a plurality of dummy RDLs 40 are included in the RDL structure 18. In some embodiments, the dummy RDLs 40 are formed at the same layer as the RDL 13. Referring to FIG. 1A and FIG. 3A, the dummy RDLs 40 and the RDL 13 are formed after the first polymer layer 12 is formed and before the second polymer layer 14 is formed. The materials and the forming method of the dummy RDLs 40 and the RDL 13 may be the same or different. The dummy RDLs 40 and the RDL 13 may be formed simultaneously or successively. Herein, when elements are described as "dummy", the elements are electrically floating or electrically isolated from other elements. That is to say, the dummy RDLs 40 are electrically isolated from the RDL 13.

Still referring to FIG. 3A, in some embodiments, the dummy RDLs 40 are located in the die attaching region 18a and the periphery region 18b of the RDL structure 18. In some embodiments, the dummy RDLs 40 are located on the first polymer layer 12, and may be configured as mesh shaped, dot shaped or any other suitable shape, and the disclosure is not limited thereto.

The recess 16 of the second polymer layer 14 may be located over the dummy RDL 40. In some embodiments, the recess 16 exposes the top surface of the dummy RDL 40 and a portion of the second polymer layer 14. The encapsulant 30 fills into the recess 16, covering and contacting the top surface of the dummy RDL 40 and the portion of the second polymer layer 14 exposed by the recess 16. The other structural features of the package structure PKG7 are similar to those of the package structure PKG1 as described in FIG. 1H, and is not described again.

Referring to FIG. 3B, in some other embodiment, in package structure PKG8, the recess 16 does not expose the dummy RDLs 40. The recess 16 may be formed in the second polymer layer 14 or/and the first polymer layer 12. The encapsulant 30 fills into the recess 16 to cover and contact the second polymer layer 14 or/and the first polymer layer 12 exposed by the recess 16.

Referring to FIG. 3C, similar to the package structure PKG4, in a package structure PKG 9, two recesses 16a' and 16b are formed in the RDL structure 18. The recess 16a' is located in the die attaching region 18a and the periphery region 18b. The recess 16b is located in the periphery region 18b. The recess 16a' may or may not expose the top surface of the dummy RDL 40. The recess 16b may or may not expose the top surface of the dummy RDL 40 or the top surface of the RDL 13. In some embodiments, the encapsulant 30 fills into the recess 16b, the adhesive layer 21 fills into the recess 16a'. Except the RDL structure 18 further includes dummy RDLs 40, the other structural features of the package structure PKG9 are similar to those of the package structure PKG4.

Similarly, in the package structures PKG1 to PKG6 (FIGS. 1H, and 2A to 2E), the RDL structure 18 may also include dummy RDLs as shown in FIG. 3A to FIG. 3C. In some other embodiments, the package structures PKG1 to PKG9 may not include dummy RDL, and some RDLs may be formed in the die attaching region 18a of the RDL structure 18. The some RDLs are electrically connected to the RDLs 13, and are overlapped with the die 28 in a direction perpendicular to the top surface TP of the RDL structure 18.

FIG. 4A to FIG. 4E illustrates example of the shapes of the recess formed in the RDL structure in top view along the top surface of the RDL structure according to some embodiments of the disclosure.

Referring to FIG. 1H, FIG. 2A, and FIG. 4A, in some embodiment, the recess 16 is formed in the periphery region 18b of the RDL structure 18. In some embodiments, the recess 16 is a continuous trench, the recess 16 may be a square ring shaped trench surrounding the die attaching region 18a, but the disclosure is not limited thereto. In some other embodiments, the recess 16 may be rectangle ring shaped, round ring shaped or any other kind of ring shaped. The depth of the recess 16 may be adjusted according to product design. In some embodiments, the recess 16 is formed in the second polymer layer 14. In some other embodiments, the recess 16 is formed in the second polymer layer 14 and the first polymer layer 12.

The extending part 30b of the encapsulant 30 is filled in the recess 16, covering and contacting the sidewalls and bottom surface of the second/first polymer layer 14/12 of the RDL structure 18 exposed in the recess 16. In other words, the extending part 30b of the encapsulant 30 is located in a region enclosed by the sidewall of the second polymer layer 14 or/and the first polymer layer 12. In some embodiments, the extending part 30b in the recess 16 is located between the TIVs 20 and the die attaching region 18a.

Referring to FIG. 1H, FIG. 2A, and FIG. 4B, in some embodiments, the recess 16 includes a plurality of small recesses TR1 non-continuously configured in the second polymer layer 14 or/and the first polymer layer 12. The recesses TR1 may be a trench or a hole, respectively. In some embodiments, the top view of the recess TR1 is rectangle, but the disclosure is not limited thereto. In some other embodiments, the top view of the recess TR1 may be square, trapezoid, circle, oval, or any other shape. The top view of different recesses TR1 may have the same shape or different shapes. The extending part 30b of the encapsulant 30 fills into the recesses TR1 and thus has the same shape as the recess TR1.

Referring to FIG. 1H, FIG. 2A, and FIG. 4C, in some embodiments, the recess 16 includes a plurality of small recesses TR2 non-continuously configured in the second polymer layer 14 or/and the first polymer layer 12. The top view of recess TR2 and the extending part 30b may be L-shaped or inverted L-shaped.

Referring to FIG. 4D, the recess 16 may include a plurality of recess TR1 and TR2 with different shapes. For example, some recesses TR1 are rectangle. Some recesses TR2 are L-shaped or inverted L shaped.

Figure 4E:
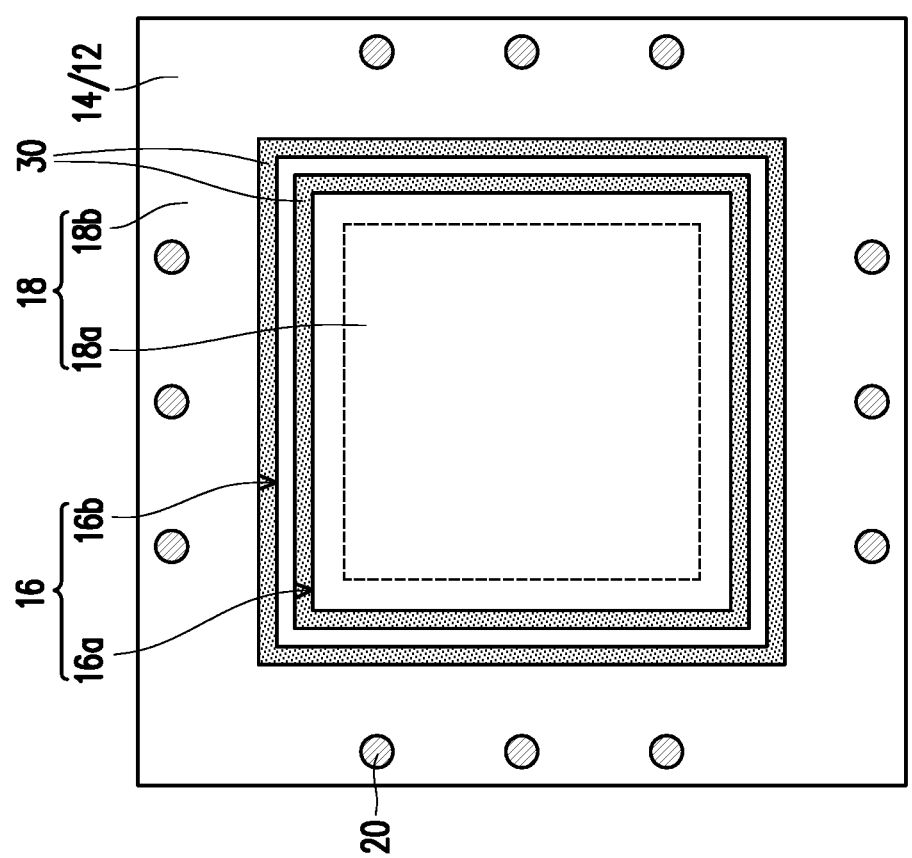

Referring to FIG. 2B and FIG. 4E, two recesses 16a and 16b are formed in the periphery region 18b of the RDL structure 18 are illustrated. The recess 16a and the recess 16b may have any shape as shown in FIG. 4A to FIG. 4D.

It is noted that, the recess shown in the cross sectional views may have any top view shown in FIGS. 4A to 4E, and the shapes of the recess of the polymer structure and encapsulant filled therein shown in the figures are merely for illustration, the recess and the extending part of the encapsulant may have any shape, as long as a portion of the encapsulant is extend into the polymer(s) of the RDL structure and the contact area between the encapsulant and the polymer layer of the RDL structure is increased.

In the embodiments of the disclosure, as the encapsulant fills into the recess of the polymer layer of the RDL structure (that is, back side RDL structure), the contact area between the encapsulant and the polymer layer is increased. Therefore, the adhesion between the encapsulant and the polymer layer is enhanced, and the encapsulant serves as a barrier to prevent water permeation, and the device reliability is thus increased.

In accordance with some embodiments of the disclosure, a package structure includes a die, a RDL structure, an encapsulant and a conductive terminal. The die is on a redistribution layer (RDL) structure. The RDL structure comprises a polymer layer and a RDL in the polymer layer. The encapsulant is on the RDL structure and laterally aside the die. The encapsulant comprises a body part and an extending part underlying the body part. The conductive terminal is electrically connected to the RDL structure and the die. The body part of the encapsulant encapsulates sidewalls of the die. The extending part of the encapsulant extends into the polymer layer.

In accordance with alternative embodiments of the disclosure, a package structure includes a die, a first RDL structure, a TIV, an encapsulant, a second RDL structure and a conductive terminal. The die is on a first polymer layer of the first RDL structure. The TIV is located on and connected to the first RDL structure, and laterally aside the die. The encapsulant is on the first RDL structure, encapsulating sidewalls of the die and sidewalls of the TIV. The second RDL structure is on the die, the TIV and the encapsulant. The conductive terminal is electrically connected to the die through the second RDL structure, and electrically connected to the first RDL structure through the TIV. A first contact area between the encapsulant and the first polymer layer of the first RDL structure is larger than a second contact area between the enecapsulant and a second polymer layer of the second RDL structure.

In accordance with some embodiments of the disclosure, a method of manufacturing a package structure includes the following steps. A RDL structure is formed. the RDL structure comprises a polymer layer and a RDL in the polymer layer. A portion of the polymer layer is removed to form a first recess adjacent to a die attaching region of the RDL structure in the polymer layer. A die is attached to the die attaching region of the polymer layer through an adhesive layer. An encapsulant is formed on the RDL structure to encapsulate sidewalls of the die and sidewalls of the TIV. The encapsulant fills into the first recess of the polymer layer. A conductive terminal is formed to electrically connected to the die and the RDL structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
a die on a redistribution layer (RDL) structure, wherein the RDL structure comprises a polymer layer and a RDL in the polymer layer;
an encapsulant on the RDL structure and laterally aside the die, wherein the encapsulant comprises a body part and an extending part underlying the body part; and
a conductive terminal, electrically connected to the RDL structure and the die,
wherein the body part of the encapsulant encapsulates sidewalls of the die, the extending part of the encapsulant extends into the polymer layer, and a bottom surface of the extending part is in contact with the RDL and/or the polymer layer of the RDL structure.

2. The package structure of claim 1, wherein the extending part of the encapsulant is overlapped with the polymer layer in a direction parallel with a top surface of the die.

3. The package structure of claim 1, wherein the bottom surface of the extending part of the encapsulant is lower than a top surface of the RDL structure, and a sidewall of the extending part of the encapsulant is in contact with the polymer layer.

4. The package structure of claim 3, wherein a portion of the bottom surface of the extending part is in contact with the RDL.

5. The package structure of claim 1, wherein the polymer layer comprises:
a first polymer layer, wherein the RDL is located on the first polymer layer; and
a second polymer layer on the first polymer layer and on the RDL, wherein the extending part of the encapsulant extends into the second polymer layer.

6. The package structure of claim 5, wherein the extending part of the encapsulant further extends into the first polymer layer.

7. The package structure of claim 1, further comprises a through integrated fan out via (TIV) penetrating through the encapsulant and the polymer layer of the RDL structure, and is electrically connected to the RDL, wherein the extending part is located between the TIV and the die.

8. The package structure of claim 1, further comprising an adhesive layer between the die and the RDL structure, wherein a portion of the adhesive layer extends into the polymer layer.

9. The package structure of claim 8, wherein the portion of the adhesive layer is separated from the extending part of the encapsulant by the polymer layer therebetween.

10. The package structure of claim 8, wherein the portion of the adhesive layer is in contact with the extending part of the encapsulant.

11. A package structure, comprising:
a die on a first polymer layer of a first RDL structure;
a TIV, located on and connected to the first RDL structure, and laterally aside the die;
an encapsulant on the first RDL structure, encapsulating sidewalls of the die and sidewalls of the TIV;
a second RDL structure on the die, the TIV and the encapsulant; and
a conductive terminal, electrically connected to the die through the second RDL structure, and electrically connected to the first RDL structure through the TIV,
wherein a first contact area between the encapsulant and the first polymer layer of the first RDL structure is larger than a second contact area between the encapsulant and a second polymer layer of the second RDL structure,
wherein a bottommost surface of the encapsulant is higher than a bottommost surface of the first RDL structure and lower than a topmost surface of the first RDL structure.

12. The package structure of claim 11, wherein a portion of the encapsulant has a step profile.

13. The package structure of claim 11, wherein
the die is attached to the first polymer layer through an adhesive layer; and
a contact area between the adhesive layer and the first polymer is larger than a contact area between the adhesive layer and the die.

14. The package structure of claim 11, wherein
the RDL structure further comprises a RDL in the first polymer layer;
the bottommost surface of the encapsulant is lower than a top surface of the first polymer layer; and
the bottommost surface of the encapsulant is higher than, coplanar with, or lower than a bottom surface of the TIV.

15. The package structure of claim 14, further comprises a dummy RDL in the first polymer layer, wherein the dummy RDL is laterally aside and electrically isolated from the RDL, and the dummy RDL is overlapped with the die.

16. A method of manufacturing a package structure, comprising:
forming a RDL structure comprising a polymer layer and a RDL in the polymer layer;
removing a portion of the polymer layer to form a first recess adjacent to a die attaching region of the RDL structure in the polymer layer;
attaching a die to the die attaching region of the polymer layer through an adhesive layer;
forming an encapsulant on the RDL structure to encapsulate sidewalls of the die, wherein the encapsulant fills into the first recess of the polymer layer, the encapsulant comprises a body part and an extending part underlying the body part, the body part of the encapsulant encapsulates sidewalls of the die, the extending part of the encapsulant extends into the polymer layer, and a bottom surface of the extending part is in contact with the RDL and/or the polymer layer of the RDL structure; and
forming a conductive terminal electrically connected to the die and the RDL structure.

17. The method of claim 16, further comprising forming a TIV penetrating through the polymer layer to electrically connect to the RDL before attaching the die, and the encapsulant is further formed to encapsulant sidewalls of the TIV, wherein the first recess is formed between the TIV and the die.

18. The method of claim 16, wherein the removing the portion of the polymer layer further comprising forming a second recess in the polymer layer.

19. The method of claim 18, wherein the adhesive layer fills into the second recess of the polymer layer.

20. The method of claim 16, further comprising the adhesive layer filling into the first recess.

* * * * *